United States Patent [19]

Sugawara et al.

[11] Patent Number: 5,432,820
[45] Date of Patent: Jul. 11, 1995

[54] MAXIMUM-LIKELIHOOD DECODING METHOD AND DEVICE

[75] Inventors: Takao Sugawara; Yoshifumi Mizoshita; Takashi Aikawa; Hiroshi Mutoh; Kiichirou Kasai, all of Kawasaki, Japan

[73] Assignee: Fujitsu Limited, Kawasaki, Japan

[21] Appl. No.: 910,311

[22] PCT Filed: Nov. 19, 1991

[86] PCT No.: PCT/JP91/01579
§ 371 Date: Jul. 26, 1993
§ 102(e) Date: Jul. 26, 1993

[87] PCT Pub. No.: WO92/09144
PCT Pub. Date: May 29, 1992

[30] Foreign Application Priority Data

Nov. 19, 1990 [JP] Japan .................. 2-311570
Nov. 26, 1990 [JP] Japan .................. 2-317917
Nov. 26, 1990 [JP] Japan .................. 2-317918

[51] Int. Cl.$^6$ .................. H03D 1/00; H04L 27/06
[52] U.S. Cl. .................. 375/341; 375/346
[58] Field of Search .................. 371/43; 375/94, 101, 375/14, 99

[56] References Cited

U.S. PATENT DOCUMENTS 4,631,735 12/1986 Qurechi .................. 375/14
4,953,183 8/1990 Bergmans et al. .................. 375/107
5,150,379 9/1992 Baugh et al. .................. 375/101

FOREIGN PATENT DOCUMENTS 63-185228 7/1988 Japan .
1-200852 8/1989 Japan .
2-226981 9/1990 Japan .

*Primary Examiner*—Stephen Chin
*Assistant Examiner*—Duane Kobayashi
*Attorney, Agent, or Firm*—Staas & Halsey

[57] ABSTRACT

A maximum-likelihood decoding method for decoding an input signal subject to intersymbol interference. An assumption is made of a measure of an interference caused by a future signal that is later in a sequence than an assumed data sequence, on the basis of a predetermined bits of sample values of said input signal that are earlier in a sequence than an assumed data sequence stored in an assumed path memory (104). An assumed sample value of said input signal by referring to this measure of interference. Maximum-likelihood decoding is conducted on said input signal, on the basis of this assumed sample value and a sample value of said input signal; a plurality of survivor paths are generated and stored in a path memory (102); data for the most likely one of survivor paths is output as a decoded data sequence.

20 Claims, 17 Drawing Sheets

P0    0 1 0

FUTURE  PRESENT  PAST

P1    0 1 1

P00   0 0 1 0

P10   1 0 1 0

MAXIMUM-LIKELIHOOD DECODING METHOD AND DEVICE

FIELD OF THE INVENTION

The present invention relates to a maximum likelihood decoding method, and to a device implementing the method, for conducting maximum-likelihood decoding on an input signal subject to intersymbol interference.

Demand for larger capacity recording precipitates a requirement for higher density recording in a magnetic disk apparatus, for example. Accordingly, because readout signals are subject to intersymbol interference to a great extent, making the task of waveform equalization difficult to achieve (e.g., to force equalization in such a case induces a greater high-band noise), a high error rate is observed in a decoding operation using peak detection or level identification. One approach, to make improvements in an error rate in decoding, is to conduct maximum-likelihood decoding on a read-out signal subject to intersymbol interference or a received signal subject to intersymbol interference in a data transmission system, using a Viterbi decoder for decoding the selected most probable sequence of the assumed data sequences.

BACKGROUND ART

A decoding system of a known magnetic recording apparatus has a construction such as the one shown in FIG.1. Therein, 11 represents a magnetic head for reproducing recorded data from a recording medium such as a magnetic disk, 12 an amplifier, 13 an equalizer, 14 a pulse shaper, 15 a phase locked loop (PLL), 16 a equalizer, 17 an A/D converter (A/D), and 18 a Viterbi decoder.

A signal reproduced by the magnetic head 11 is amplified by the amplifier 12, subjected to equalizing amplification by the equalizers 13 and 16 consisting of filters, for example, and has its noise removed. The pulse shaper 14 generates pulses by peak detection, and a clock signal is obtained by means of the phase locked loop 15, which signal is synchronous with a read-out signal. This clock signal is then used as a sampling clock signal of the A/D converter 17; the read-out signal, equalized by the equalizer 16, is furnished to the A/D converter 17 and sampled thereby, responsive to the one-bit-rate sampling clock signal from the phase locked loop 15, so as to be converted to a digital signal. Sample values of the read-out signal, thus converted to a digital signal, all furnished to the Viterbi decoder 8 so as to be decoded by maximum-likelihood decoding.

Viterbi decoder is known as a maximum-likelihood decoder for convolution codes and comprises, as shown in FIG. 2, a distributor 21, ACS circuits 22-1-22-4, a path memory 23, a normalizing circuit 24 and a path selector 25, the distributor 21 being used in computing a branch metric value for distribution to ACS circuits 22-1-22-4. Given that the constraint length of convolution codes is k, the number of ACS circuits to be provided is $2^{k-1}$. The provision of 4 ACS circuits provided in FIG. 2 indicates a case in which the constraint length k=3.

Each of the ACS circuits 22-1-22-4 comprises an adder (A), a comparator (C) and a selector (S), in which the adder (A) adds the branch metric value and the previous metric value, the comparator (C) compares those values, and the the selector (S) selects the smaller metric value as the path metric value of the survivor path. The path selection signal thereof is stored in the path memory 23. The path memory 23, containing a number of stages of path memory cells which is as many as 4-5 times that of the constraint length k, stores the signal as the survivor path. The output of the final stage is furnished to the path selector 25, after which the path corresponding to the smallest path metric value is selected. The decoded output is thus obtained. When the number of digits becomes so large as to cause an overflow in computing the path metric value, the normalizing circuit 24 normalizes the path metric value. When employing a Viterbi decoder of this configuration in decoding a signal subject to intersymbol interference, the ACS circuits create a new path metric value by adding the previous path metric value to the output obtained by squaring the difference between the assumed sample value and the actual sample value. The ACS circuits then compares each path metric value and select the smallest of the path metric values, namely the values output from the adder. The selected value becomes the next path metric value and is stored in the path memory 73.

FIG. 3 illustrates a trellis diagram obtained when the constraint length is 3, solid arrows indicating a transition when an input data is "0", broken arrows indicating a transition when an input data is "1", and circles indicating an internal state. For example, the assumed sample values on paths P0 and P1 can be assumed to be $Y_{p0}$ and $Y_{p1}$ indicated by solid black circles in waveforms (a) and (b) of FIG. 4. These values are obtained from 3 bits of assumed path values $(a_{-1}, a_0, a_1)$ shown in the range of "present" in FIG. 4 (a). Given that a sample value taken from an isolated waveform of FIG. 4 (C) taken at one-bit rate is $g_i$, the constraint length k, and $m=(k-1)/2$, y is obtained by $$y = \sum_{i=-m}^{-m+k-1} g_{-i} a_i \quad (1)$$

For example, when the constraint length k=3, m=1. Therefore, $Y_{P0}$ and $Y_{P1}$ will be obtained by calculating (1) in the range from i=−1 to i=+1.

If we take into consideration interference from past data, values stored in the memory $(b_2, b_3, \ldots)$ will be taken advantage of as follows.

$$y = \sum_{i=-m}^{-m+k-1} g_{-i} a_i + \sum_{i=-m+k}^{n} g_{-i} b_i \quad (2)$$

FIG. 5 is a block diagram of the main portion of an example of known technology in which a past data is taken into consideration and the calculation of (2) is conducted. This example comprises an ACS circuit 31, a path memory 32, a path selector 33 and an assumed path memory 34, wherein sample values of a signal, the read-out signal of magnetic disk apparatuses, for example, which signal is to be decoded, is furnished to the ACS circuit 31. Each of the path memory 32 and the assumption path memory 34 is constructed of a combination of shift registers capable of storing "1", "0" and "−1" because the read-out signal of magnetic recording apparatuses have polarity. The assumption path memory 34 stores a plurality of mutually different assumed data sequences.

Assumed sample values, allowing for interference from past data, are obtained on the basis of these assumed data sequences and the contents of the path memory 32. The ACS circuit 31 adds the output obtained by squaring a difference between the assumed sample value and the sample value of the read-out signal, for example to the previously computed path metric value. The ACS circuit then compares outputs from the adder and selects the smaller of the two values, which is designated as the next metric value. The last-in-line value of the assumed path memory 34 is furnished to the path memory 32.

Accordingly, while the value of the path memory 32 is not the most likely one as the decoded value, it is the tentatively likely one because it is in series with the assumed path memory. The path selector 33 detects the smallest tentative path metric value, selects a path leading to the status, and outputs the last-in-line data as the decoded output. Arrows connecting the path memory 22 and the assumption path memory 34 indicate conducting multiplication and addition, as directed by equation (2) and obtaining a tentative assumed sample value.

As described before, by allowing for interference from past data, an accurate assumption of assumed sample value is possible. However, when considering a path preceding by one bit (one bit before the present moment), assumed sample values when designating, as P00 and P10, the paths following the path P0 in the trellis diagram of FIG. 3, a large error is produced unless we take into account $y_{P00}$ and $Y_{P10}$ respectively shown as black solid circles in waveforms (d) and (e) of FIG. 4. Consequently, it is necessary to increase the constraint length k, that is, to increase the number of bits of the assumed path, in order to ascertain the measure of interference accurately. However, since the scale of the decoder circuit is proportional to $2^{(k-1)}$, increasing k produces a huge scale of the circuit and therefore is difficult to achieve.

In a decoding method allowing for interference from past data like, such as the known method shown in FIG. 5, no consideration is given as to the interference caused by future data and effects thereof on the current data, as described before. Hence, there is a need for a special equalization so as to cancel such an interference totally. In terms of practicality, the need for this equalization is particularly important in a magnetic disk apparatus in which the measure of interference differs from one track to another in a magnetic recording medium.

DISCLOSURE OF THE INVENTION

An object of the present invention is to make an improvement in decoding error rate without increasing a scale of a circuit.

The above object is achieved by a maximum-likelihood decoding method for decoding an input signal subject to intersymbol interference comprising steps of (a) assuming a measure of interference caused by a future signal that is later in a sequence than an assumed data sequence, on the basis of predetermined bits of sample values of said input signal that are earlier in the sequence than the assumed data sequence stored in an assumed path memory; (b) obtaining a sample value of said input signal by referring to measures of interferences; and (c) generating a plurality of survivor paths by conducting maximum-likelihood decoding on said input signal employing said assumed sample value and said obtained sample value of said input signal, after which the generated survivor paths are stored in a path memory, and a data for the most likely survivor path is output as a decoded data sequence.

The above object can also be achieved by a maximum-likelihood decoding method for decoding an input signal subject to intersymbol interference comprising:

A/D (analog/digital) converting means for conducting sampling on of input signal and generating a sample value;

an assumed path memory for storing an assumed data sequence;

an assumed sample value computing means for obtaining an assumed sample value of said input signal by assuming a measure of interference caused by a future signal that is later in a sequence than an assumed data sequence on the basis of a predetermined bits of sample values of said input signal that are earlier in a sequence than an assumed data sequence stored in said assumed path memory, and by referring to said measure of interference; and decoding means for outputting the most likely one of a plurality of survivor paths as a decoded data sequence, after storing the survivor paths generated by conducting maximum-likelihood decoding on said input signal on the basis of said assumed sample value and a sample value of said input signal.

BRIEF DESCRIPTIONS OF THE DRAWINGS

BEST MODE OF CARRYING OUT THE INVENTION

Figure 6:
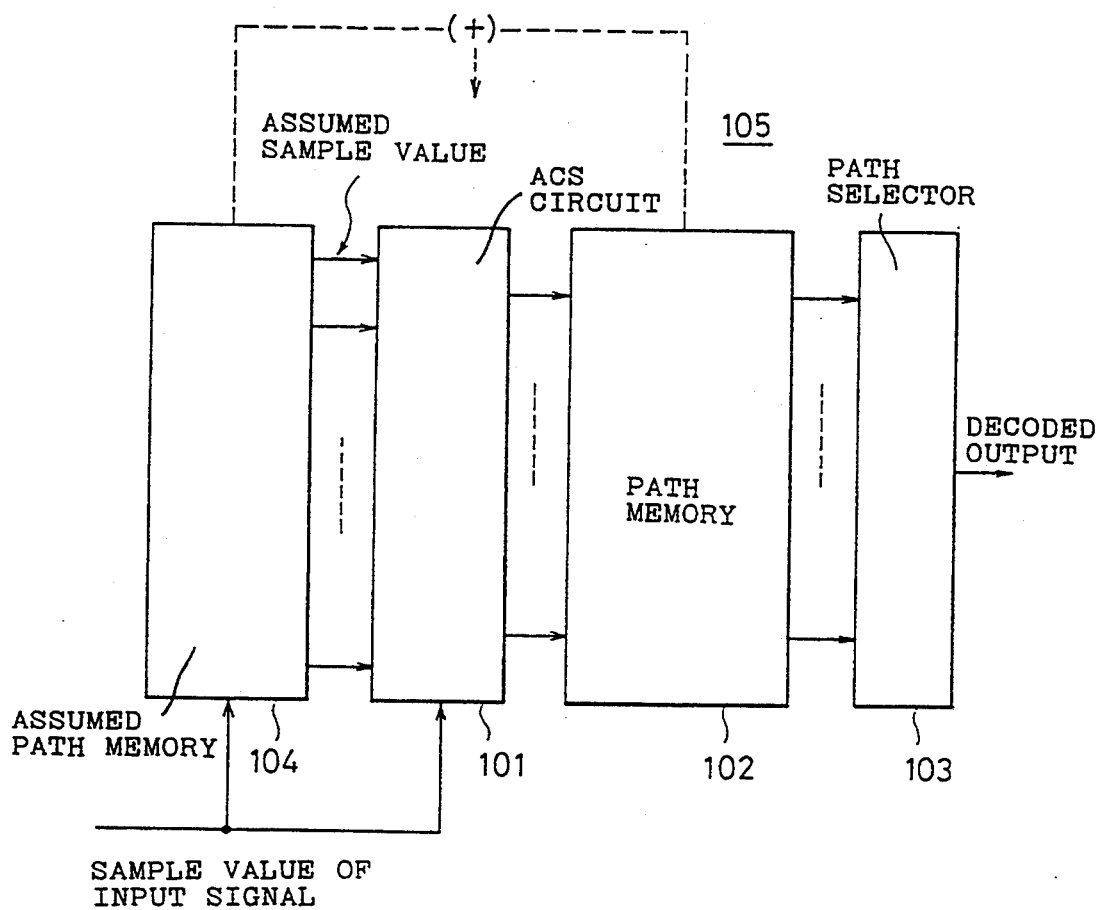
FIG. 6 is a block diagram describing the principle of the present invention.

FIG. 6 is a block diagram showing the principle of the present invention.

A maximum-likelihood decoding portion 105, comprising an ACS circuit 101, a path memory 102, a path selector 103 and an assumed path memory 104, is designed for conducting maximum-likelihood decoding on sample values of an input signal subject to intersymbol interference. A measure of interference is assumed on the basis of several bits of sample values that are earlier in the sequence than the assumed data sequence in the assumed path memory 104; the assumed sample values allowing for this measure of interference are obtained; the assumed sample values and the sample values of the input signal are input into the ACS circuit 101 so as to go through i.e., undergo, or be subjected to, maximum-likelihood decoding.

Specifically, an assumption of a measure of interference and the computing of assumed sample values is conducted in the following way. A first assumption/-computation method allows for the assumption of an amount of interference caused by a future signal, on the basis of several bits of sample values of an input signal that are earlier in the sequence than the assumed data sequence in the assumed path memory 104 and the assumed data sequence in the assumed path memory 104. Assumed sample values to be furnished to the ACS circuit 101 are then obtained on the basis of this measure of interference, the assumed data sequence in the assumed path memory 104 and the contents of the path memory 102.

A second assumption/computation method allows an assumption of a measure of interference, caused by a future signal, on the basis of several bits of sample values of an input signal that are earlier in the sequence than the assumed data sequence in the assumed path memory 104 and the assumed data sequence in the assumed path memory 104 and further, also allows an assumption of a measure of interference caused by a past signal on the basis of several bits of the sample values of an input signal that are later in the sequence than the assumed data sequence in the assumed path memory 104, so that the assumed sample values are obtained on the basis of the measure of interference of the future signal, the assumed data sequence in the assumed path memory 104 and the measure of interference of the past signal.

A third assumption/computation method allows an assumption of a measure of interference caused by a future signal on the basis of several bits of sample values of an input signal that are earlier in the sequence than the assumed data sequence in the assumed path memory 104 and the assumed data sequence in the assumed path memory 104, an assumption of a first measure of interference caused by a past signal on the basis of several bits of the sample values of an input signal that are later in the sequence than the assumed data sequence in the assumed path memory 104 and an assumption of a second measure of interference caused by a past signal on the basis of the contents of the path memory 102, allowing a further selection of the second measure of interference when the output from the last stage of the path memory 102 converges and a selection of the first measure of interference when it does not converge, so that the assumed sample values can be obtained on the basis of the selected measure of interference, the assumed data sequence in the assumed path memory 104, and the measure of interference caused by a future signal.

According to the principle of the present invention, when the assumed sample values, computed on the basis of the assumed data sequence in the assumed path memory 104, are furnished to the ACS circuit 101, a measure of interference caused by a future signal is assumed by conducting multiplication and addition on one or a plurality of bits of the sample values of the input signal that are earlier in the sequence than the assumed data sequence. That is, a consideration is given to intersymbol interference, either across two congruous bits or across bits that are several bits apart, so as to compute assumed sample values accurately. Accordingly, by conducting maximum-likelihood decoding on the basis of the difference between this assumed sample value and the sample values of the input signal, an improvement in an error rate is achieved without causing a lengthy assumed data sequence (the constraint length).

The first assumption and computation method allows an assumption of a measure of interference caused by a future signal on the basis of several bits of sample values that are earlier in the sequence than the assumed data sequence in the assumed data path memory 104 and the assumed data sequence in the assumed path memory 104, after the sample values of the input signal are input into shift registers, for example. The assumed sample values are computed on the basis of this assumed measure of interference, the assumed data sequence in the assumed path memory 104 and the contents of the path memory 102. That is, the assumed sample value is obtained in consideration of the measure of interference caused by a future signal and the measure of interference caused by a past signal.

The second assumption and computation method allows a computation of the measure of interference caused by a past signal on the basis of sample values of the input signal that are later in the sequence than the assumed data sequence in the assumed path memory 104. In the presence of any error in the contents of the path memory 102, the error is reflected in the computation of the measure of interference, and therefore, the error could be spread. If, however, the sample values of the input signal are employed, the spread distribution of the error is avoided.

The third assumption and computation method allows the obtaining of the amounts of interference caused by a past signal; namely the first measure of interference computed on the basis of sample values of the input signal and the second measure of interference computed on the basis of the contents of the path memory 102, permitting a determination of whether or not the output of the last stage of the path memory 102 converged, and upon which the second measure of interference is selected if the convergence is found to take place or the first measure of interference is selected if the convergence is not found to take place. The assumed sample values are obtained on the basis of the selected measure of interference, the assumed data sequence in the assumed path memory and the measure of interference caused by a future signal.

A detailed description of the embodiments of the present invention Will be given by referring to the drawings.

Figure 7:
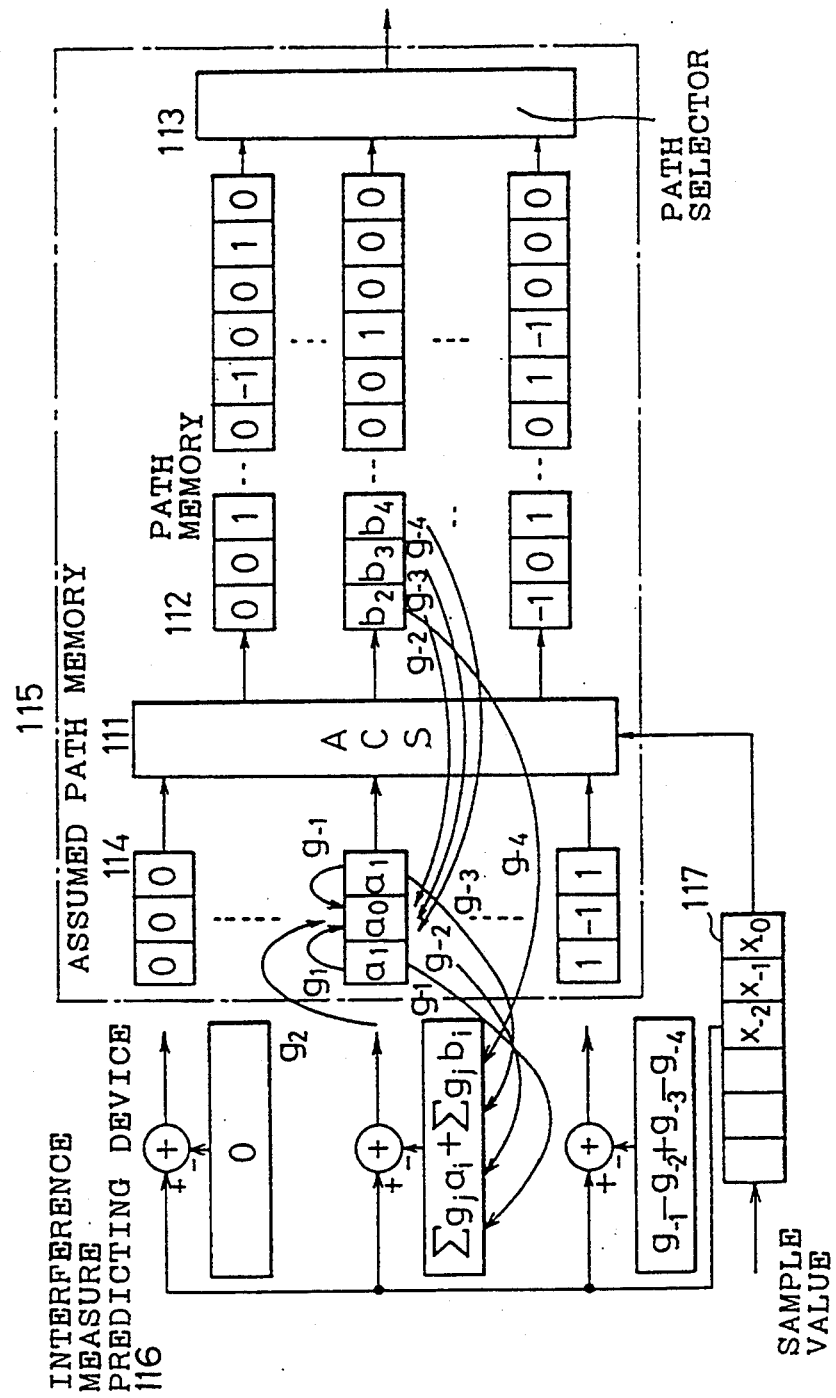
FIG. 7 is a block diagram of a Viterbi decoder of the first embodiment of the present invention.

FIG. 7 is a block diagram of the main portion of the first embodiment of the present invention. This embodiment is configured in such a way that an interference measure predicting device 116 and a shift register 117 are attached to a decoder 115 comprising an ACS circuit 111, a path memory 112, a path selector 113 and an assumed path memory 114. An input signal, such as read-out signals in a magnetic recording apparatus which are subject to intersymbol interference or received signals in a data transmission system are sampled at one-bit rate, after which the sampled values (digital values) are input into the shift register 117.

FIG. 7 shows a case in which an assumed data sequence in the assumed path memory 114 contains 3 bits (the constraint length k=3), namely $a_{-1}$, $a_0$, and $a_1$ ("0, 0, 0"–"1, −1, 1"). In correspondence with this data, the assumed sample value is obtained on the basis of 3 bits in the path memory 112, namely $b_2$, $b_3$, and $b_4$ (see (a) in FIG. 4), and $x_{-2}$, which is one of the 3 bits, namely $x_0$, $x_{-1}$, and $x_{-2}$, in the shift register 117. Interference measure predicting device 116 predicts a measure of interference on the basis of the sample value $x_{-2}$ that corresponds to the data one bit earlier than the assumed data sequence, the assumed data sequence $a_{-1}$, $a_0$, and $a_1$, and $b_2$, which is a content of the path memory 12 corresponding to the data one bit later than assumed data sequence.

Figure 8:
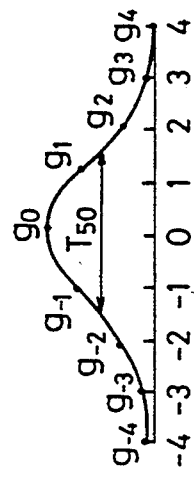
FIG. 8 is a diagram showing a intersymbol interference.
Figure 9:
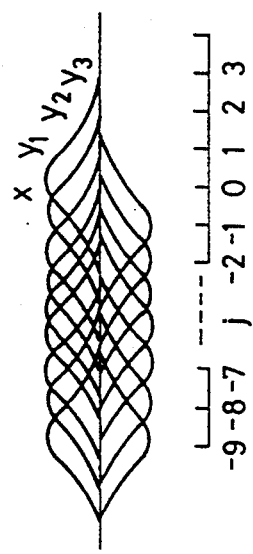
FIG. 9 is a diagram showing an isolated waveform.

As described earlier, when trying to obtain the assumed sample value in consideration of future data, the assumed sample value y is expressed by $$y = \sum_{i=-m}^{-m+k-1} g_{-1} a_i + \sum_{i=-m+k}^{n} g_{-1} b_i + \sum_{i=-n}^{-m-1} g_{-1} c_i \quad (3)$$

by which a measure of interference caused by a future signal is assumed on the basis of the value $a_i$ in the assumed path memory 114, the value $b_i$ of the path memory 112, the corresponding measure of interference $g_i$, and the actual sample values that have sequential correspondence to these. Further, $$\sum_{i=-n}^{-m-1} g_{-i} c_i + \sum_{i=-n+m+1}^{0} g_{-j} c_j \quad (4)$$

indicates a conversion from a system (i) in which the moment at which the assumed sample value is obtained is designated 0, to a system (j) in which the bit immediately preceding the assumed sample value in the assumed path is designated 0. Waveforms in FIG. 8 are obtained when data sequences are ascertained in a 10-bit range for $c_j$ (j=0–9) while assuming all conceivable combinations of 0 and 1. A Lorentzan waveform, such as the one shown in FIG. 9 was assumed as the isolated waveform thereof. This Lorentzan waveform g(t) is expressed as $$g(t) = \frac{1}{1 + (2t/T_{50})} \quad (5)$$

Figure 10:
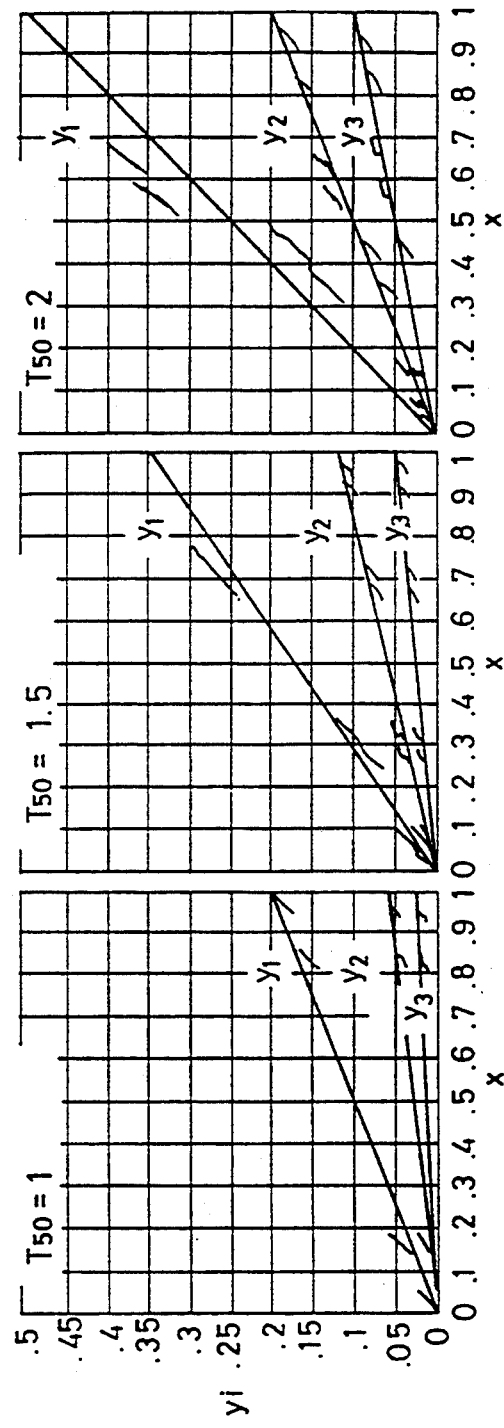
FIG. 10 is a graph showing variations of measure of interference.

FIG. 10 shows variations of the measure of interference ascertained for the respective cases of $T_{50}=1$, 1.5, 2, wherein the horizontal line indicates an amplitude x when j=0 and the vertical line indicates the measure of interference $y_1$ when j=1, 2, 3. For example, m==1 when the constraint length k=3, the assumed sample value being assumed on the basis of the measure of interference when j=2, so an approximation by a straight line is possible if we focus on $y_2$. That is, given $g_0=1$, the following equation obtains:

$$\sum_{i=-n}^{-m-1} g_{-i} c_i = g_{-(-m-1)} x_{-m-1} \quad (6)$$

t

Since this equation (6) does not take into account the measure of interference from the assumed path memory 114 or the path memory 112 to the amplitude x. If this measure is taken into account, the equation will be as follows:

$$\sum_{i=-n}^{-m-1} g_{-i} c_i = g_{-(-m-1)} \times \quad (7)$$

$$\left( x_{-m-1} - \left( \sum_{j=1}^{k} g_{-j} a_j + \sum_{j=k+1}^{n} g_{-j} b_j \right) \right)$$

Inserting this into the aforementioned equation (3), the assumed sample value y will be obtained as:

$$y = \sum_{i=-m}^{-m+k-1} g_{-i} a_i + \sum_{i=-m+k}^{n} g_{-i} b_i + \quad (8)$$

$$g_{-(m-1)} \left[ x_{-m-1} - \left( \sum_{i=-m}^{-m+k+1} g_{-(i+m+1)} a_i + \sum_{i=-m+k}^{n} g_{-(i+m+1)} b_i \right) \right]$$

If we assume that the constraint length k=3, then m=1, and the first term in (8) will indicate an addition of the result of multiplication in which the assumed data sequence $a_{-1}$, $a_0$, $a_1$ are multiplied by the sample values of an isolated waveform in a range i=−1, 0, 1. When n=4 and therefore i=2, 3, 4, the second term indicates an addition of the result of multiplication in which the contents of the path memory 112, namely $b_2$, $b_3$, $b_4$ is multiplied by the sample values $g_4$, $g_3$, $g_2$ of the isolated waveform. The first term in the small parenthesis in the third term indicates an addition of the result of multiplication in which the sample values of the isolated values $g_{-1}$, $g_{-2}$, $g_{-3}$ are multiplied by the assumed data sequence $a_{-1}$, $a_0$, $a_1$. The second term in the small parenthesis indicates an addition of the result of multiplication in which the sample values of the isolated waveform, namely $g_{-4}$, $g_{-5}$, $g_{-6}$ are multiplied, in a range i=2, 3, 4, by the contents of the path memory 113, namely $b_2$, $b_3$, $b_4$. The result of the addition thereof are subtracted from $X_{-2}$ before being multiplied by the sample value $g_2$ of the isolated waveform. Arrows in FIG. 7 indicate addition and multiplication operations in (8).

Figure 11:
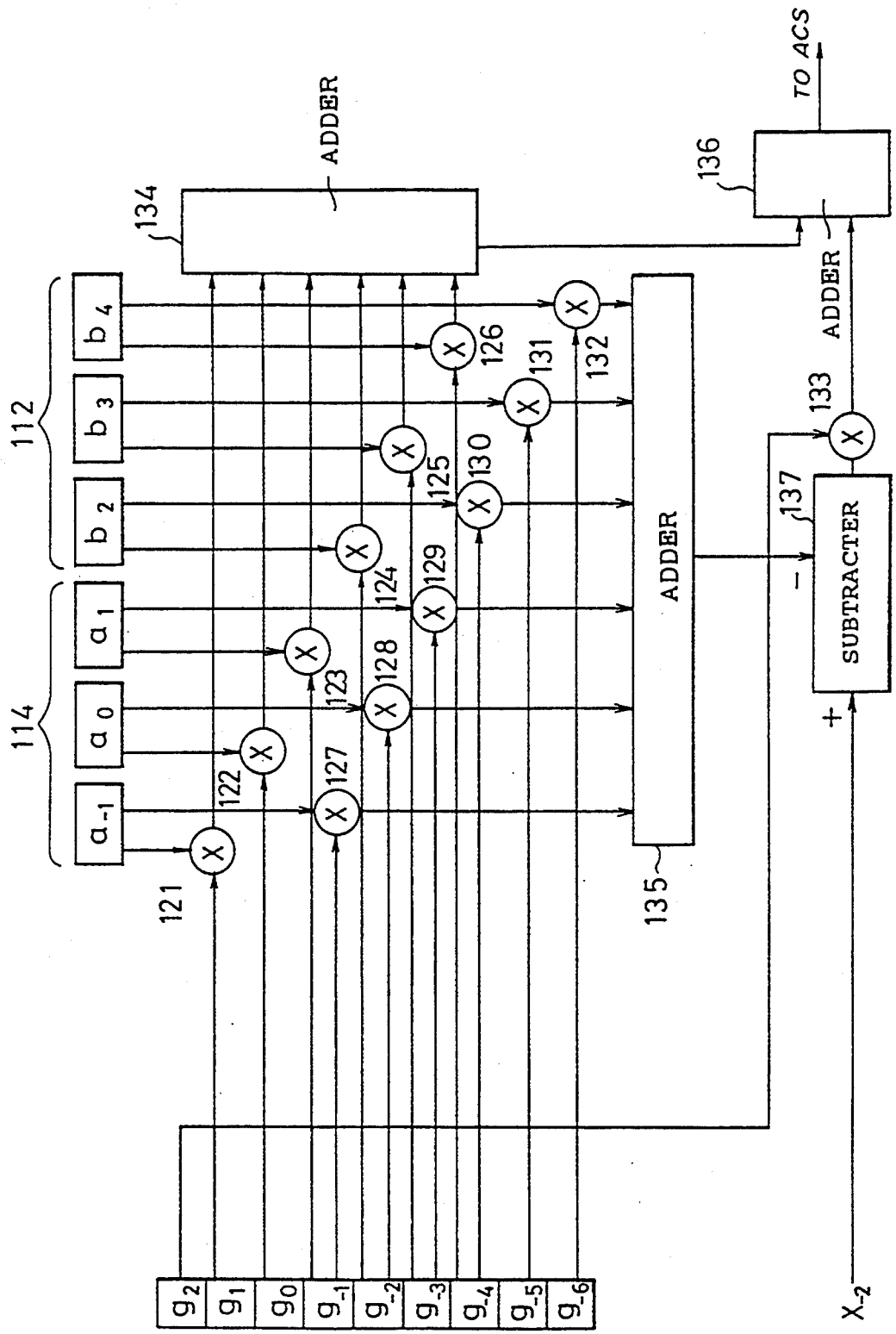
FIG. 11 is a block diagram of an assumed sample value computing portion employed in the first embodiment of the present invention.

FIG. 11 indicates a specific configuration designed for obtaining the assumed sample values in accordance with the above-mentioned equation (8), wherein multipliers 121–133, adders 134–136, and subtracters 137 are integrated. The operations of the first term in (8) are conducted by the assumed data sequence $a_{-1}$, $a_0$, $a_1$ of the assumed path memory 114 being multiplied by the sample values of the isolated waveform, namely $g_1$, $g_0$, $g_{-1}$ by means of the multipliers 121–123, and the multiplied result being added by the adder 134. The operations of the second term in (8) are conducted by the contents of the path memory 112, namely $b_2$, $b_3$, $b_4$ being multiplied by the sample values of the isolated waveform, namely $g_4$, $g_3$, $g_2$, and the multiplied result being added by the adder 134. The operations of the third term in the parenthesis of (8) are conducted by each of the results of multiplication by means of the multipliers 127–132 being added by the adder 135. The operations of the third term in (8) are conducted by the result from the above calculation being subtracted from the sample value $X_{-2}$ of the input signal by means of the subtracter 135, and being multiplied by $g_2$ by means of the multiplier 133. The adder 136 adds up the results of the operation of each term. This way the assumed sample value y to be added to the ACS circuit 111 is obtained.

The ACS circuit 111 creates a new metric value by adding the output obtained by squaring the difference between the sample value $X_0$ of the input signal, input via the shift register 117, and the above-mentioned assumed sample value y, to the previous metric value. The circuit then compares the metric values and designates the smaller one as the next metric value, adds the last-in-line data in the selected assumed data sequence to the path memory 112 and outputs the decoded output obtained, on a decision-of-majority basis, from output of the last stage of the path memory 112.

Figure 12:
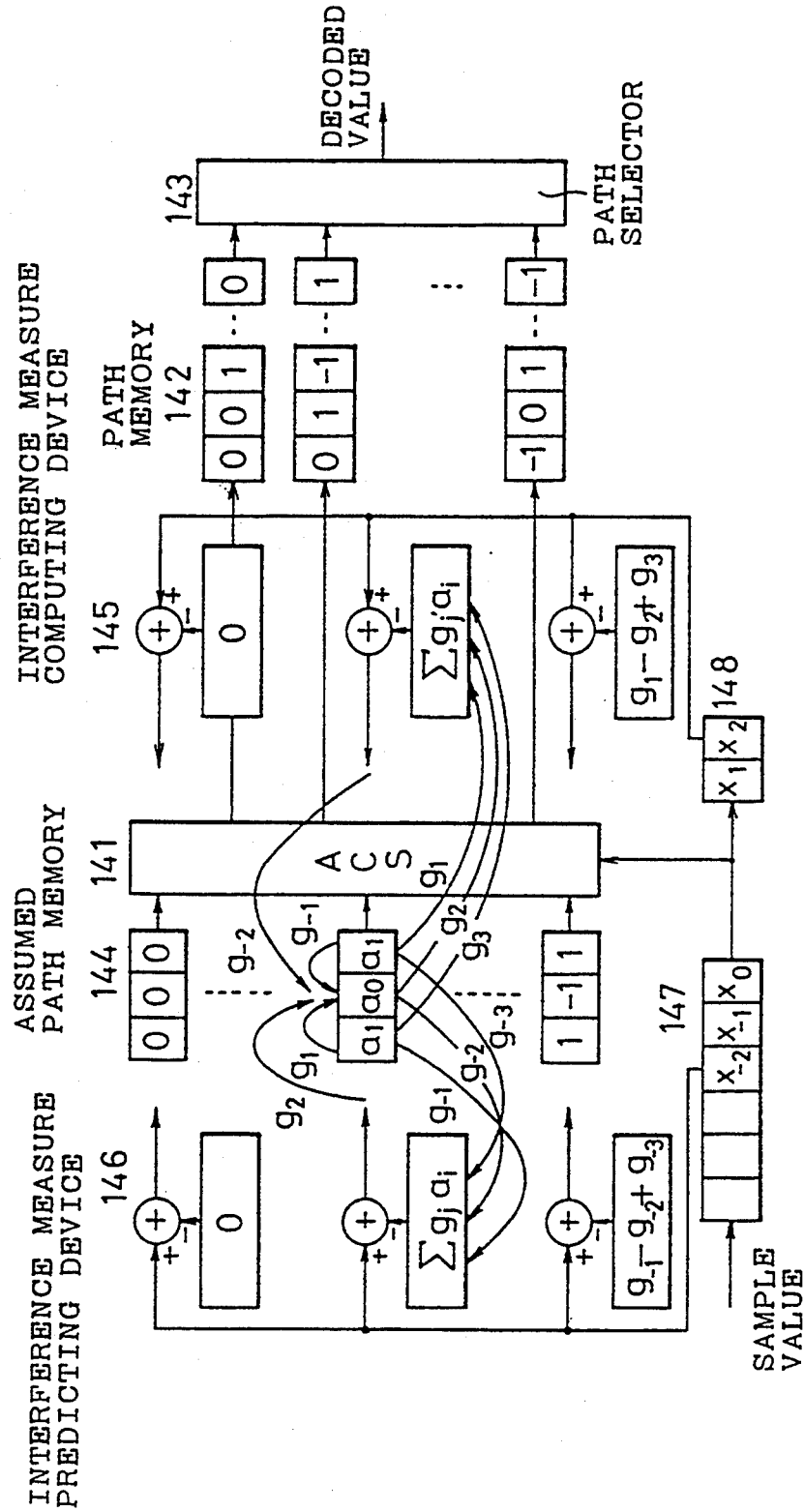
FIG. 12 is a block diagram of a Viterbi decoder of the second embodiment of the present invention.

FIG. 12 is a block diagram of the main portion of the second embodiment of the present invention, in which the sample values of the input signal are used as the past data; an ACS circuit 141 comprises a path memory 142, a path selector 143, an assumed path memory 144, an interference measure computing device 145, an interference measure predicting device 146, and shift registers 147 and 148.

The sample value of the input signal is input into the ACS circuit 141 via the mode of the connecting stages of the shift registers 147 and 148; the sample value of $X_{-2}$ of the shift register 147 is input into the interference measure predicting device 146; the sample value of the output from the shift register 148 is input into the interference measure computing device 145. The assumed sample value y to be added to the ACS circuit 141 is obtained according to the aforementioned equation (3); the first term thereof is obtained from the value of the assumed path memory 144; the second term is obtained, not by using the value of the path memory 142, but by means of the interference measure computing device 145 and using the past sample value $X_2$; the third term is obtained by means of the interference predicting device 146 and using the future sample value $X_{-2}$.

The second term of the aforementioned equation (3) is $$\sum_{i=m+1}^{n} g_{-i} b_i = g_{-(m+1)} X_{m+1} \qquad (9)$$

The third term of the equation (3) is: represented by the aforementioned equation (6). The equation (9) and the aforementioned (6) do not take into account the measure of interference from the path memory 144 and the path memory 142 with the sample value X. Taking it into account, the equation (9) becomes:

$$\sum_{i=m+1}^{n} g_{-i} b_i = g_{-(m+1)} \times \left[ X_{m+1} - \left( \sum_{j=-1}^{-k} g_{-j} a_j + \sum_{j=k-1}^{-n} g_{-j} c_j \right) \right] \qquad (10)$$

The equation (6) thus becomes the aforementioned equation (7).

Accordingly, the sample value y is $$y = \sum_{i=-m}^{-m+k-1} g_{-a_i} + g_{-(m+1)} \qquad (11)$$

$$\left[ X_{m+1} - \left( \sum_{i=-m}^{-m+k-1} g_{-(i-m-1) a_i} \right) \right] + g_{-(-m-1)}$$

$$\left[ X_{-m-1} - \left( \sum_{i=-m}^{-m+k-1} g_{-(i+m+1) a_i} \right) \right]$$

That is, the configuration shown in FIG. 12 gives the assumed sample value y. In a similar manner as the aforementioned embodiment, arrows indicate multiplications and additions. The computing of the assumed sample value is realized by multipliers and adders in a configuration similar to the one shown in FIG. 11.

Because the equation (11) is employed in computing the measure of interference on the basis of the past sample value so that the assumed sample value is obtained, the spread of an error in decoding is avoided, unlike the case in which the contents of the path memory 142 are used in determining the measure of interference.

Figure 13:
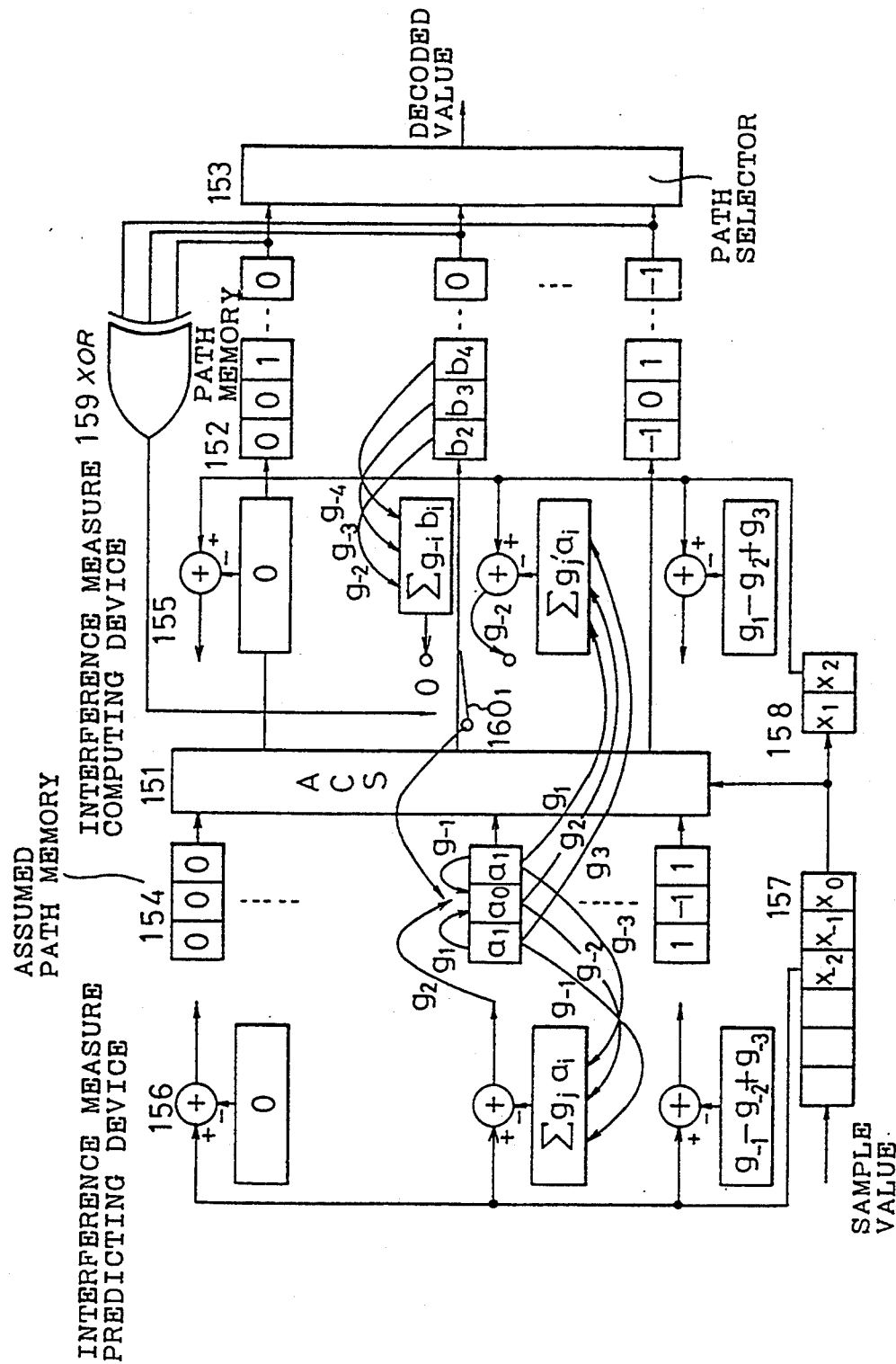
FIG. 13 is a block diagram of a Viterbi decoder of the third embodiment of the present invention.

FIG. 13 is a block diagram of the main portion of the third embodiment of the present invention comprising an AC circuit 151, a path memory 152, a path selector 153, an assumed path memory 154, an interference measure computing device 155, an interference amount predicting device 156, shift registers 157 and 158, an XOR circuit 159, and a switching circuit 160.

This embodiment allows the switching between the two measures of interference caused by past data, namely the first measure of interference computed on the basis of the past sample value $X_2$ and the measure of interference computed on the basis of the values $b_2$, $b_3$, $b_4$ of the path memory 152, by means of the switching circuit 160 whose switching performance is controlled by the output from the XOR circuit 159, so that the assumed sample value y is obtained. That is, if the output from the last stage of the path memory 152 converges, the output from the XOR circuit 159 becomes "0", and the switching circuit 160 resultingly selects the measure of interference obtained on the basis of the path memory 152; if the output from the last stage of the path memory 152 does not converge, the output from the XOR circuit 159 becomes "1", and the switching circuit 160 resultingly selects the measure of interference obtained on the basis of the past sample value.

Accordingly, when there is an occurrence of a decoding error causing the output from the last stage of the path memory 152 not to converge, the measure of interference is computed on the basis of the past sample value, which measure of interference is used in obtaining the assumed sample value, thus enabling the avoidance of a spread of an error.

Figure 14:
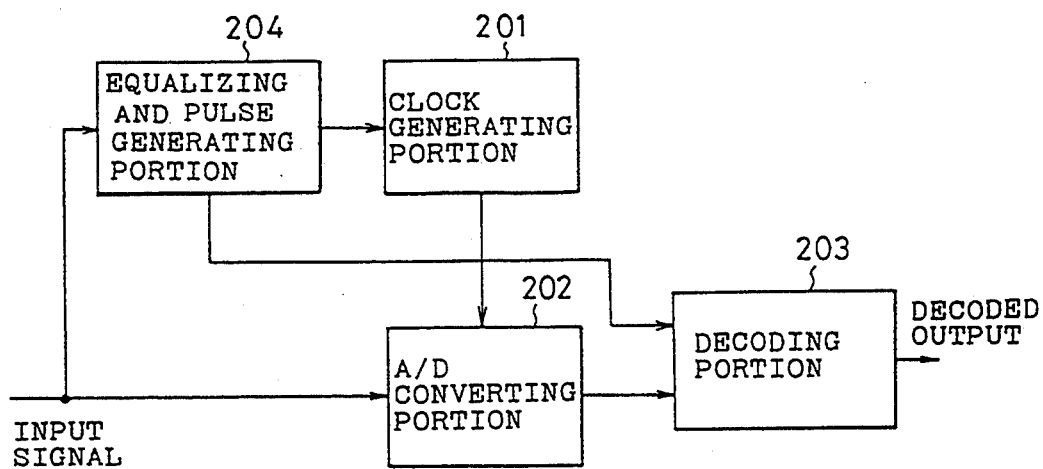
FIG. 14 is a block diagram of the fourth embodiment of the present invention.

FIG. 14 is a block diagram of the main portion of the fourth embodiment of the present invention comprising a decoding portion utilizing the aforementioned equation (3). Specifically, intersymbol interference caused by future data is assumed on the basis of the signal on a path for regenerating clock signals so that an improvement is made in an error rate in decoding. The fourth embodiment equalizes the input signal, which is subject to intersymbol interference, and puts out pulses thereof in the pulse generating portion 204, and comprises a clock generating portion 201 for generating sampling clock signals synchronous with the pulses, an A/D converting portion 202 for sampling the input signal on the basis of the sampling clock signals from this clock regenerating portion 201, the decoding portion 202 for conducting maximum-likelihood decoding on the basis of the sample value from this A/D converting portion 202 and the assumed sample value, wherein the decoding portion 202 allows the obtaining of the assumed sample value by assuming the measure of interference caused by previous data that is earlier in the sequence than the current sample value, on the basis of the sample value after the equalization of the input signal or on the basis of the pulses after they are generated. Maximum-likelihood decoding is conducted using the assumed sample value thus obtained.

The decoding portion 203 comprises a shift register for accepting inputs of the sample value after the equalization of the pulses after the pulse generation, an ACS circuit for accepting inputs of the sample value of the input signal, an assumed path memory, a path memory and a path selector and wherein the assumed sample value is obtained on the basis of the contents of the shift register, the contents of the assumed path memory and the contents of the path memory, after which the assumed sample value is input into the ACS circuit.

In the fourth embodiment, either the sample value obtained by sampling, by the A/D converter 202, the equalized output resulting from the input signal subject to intersymbol interference, or the pulse to be furnished to the clock regenerating portion 201 indicates the result of hard decision on the equalized input signal, which result is input into the decoding portion 203 as the tentative decoded value. This tentative decoded value can be utilized to assume the measure of interference caused by future data and to obtain the assumed sample value so that the assumed sample value, allowing not only for the assumption of the measure of interference on the current data caused by past data but also the measure of interference caused by future data, can be put to use. Therefore an improvement in a decoding error rate is achieved without having a lengthy constraint length.

In the fourth embodiment, the decoding portion 203 allows the inputting of the tentative decoded value into the shift register and the inputting of the sample value of the input signal into the ACS circuit. The assumed sample value is obtained allowing for the assumption of the measure of interference on current sample data caused by past and future data, on the basis of the contents of the shift register, the contents of the assumed path memory, and the contents of the path memory. The assumed sample value is then input into the ACS circuit; maximum-likelihood decoding is conducted by adding the output, obtained by squaring the difference between the assumed sample value and the sample value of the input signal, to the previous metric value, and by selecting the one found to be smaller in value as a result of comparison.

Figure 15:
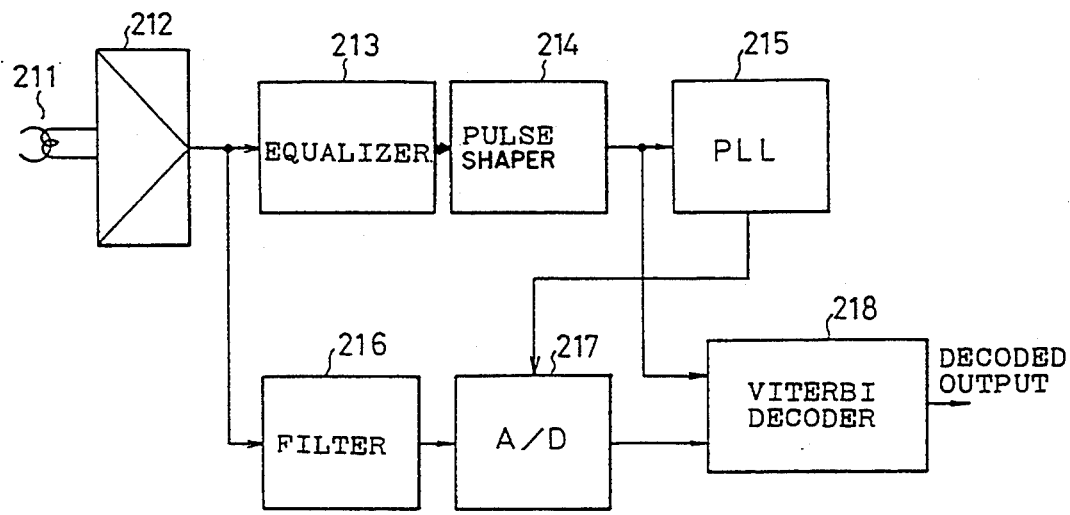
FIG. 15 is a block diagram showing the fourth embodiment of the present invention in detail.

FIG. 15 is a block diagram showing the fourth embodiment of the present invention in detail, wherein recorded information is reproduced by a head 211 from a magnetic recording medium in a magnetic disk apparatus, for example, and the read-out signal is used as an input signal in decoding. As shown in the figure, the fourth embodiment comprises an amplifier 212, an equalizer 213, a pulse shaper 214, a phase locked loop 215, a filter 216, an A/D converter 217, a Viterbi decoder 218.

The input signal, subject to intersymbol interference as described before, is amplified by the amplifier 212 and then furnished to the equalizer 213 and the filter 216. The input signal that went through a waveform equalization in the equalizer 213 is turned into pulses in the pulse shaper 214 by means of peak detection, for example, and furnished to the phase locked loop 215. The clock signals, whose phases are locked to the pulses are applied from this phase locked loop 215 to the A/D converter 217 as sampling clock signals; sampling of the input signal is conducted in the A/D converter 217 by an interposition of the filter 216; the converted digital signal is now furnished to the Viterbi decoder 218; pulses corresponding "1" and "0" of the input signal from the pulse shaper 214 are applied to the Viterbi decoder 218 as tentative decoded value.

The pulse shaper 214 includes a differentiating circuit and a zero cross detection circuit, for example, and functions in the following manner. The output signal from the equalizer 213 is differentiated by the differentiating circuit; the output resulting from a differentiation of the peak of the signal being zero, the zero cross detection circuit outputs a pulse after detecting a point in the signal where the zero output is obtained. The Viterbi decoder 218 has a configuration such as the one shown in FIG. 16, and comprises a Viterbi decoder 221 and a shift register 222, as the conventional embodiment shown in FIG. 2. The Viterbi decoder 218 includes an assumed path memory 223, an ACS circuit 224, a path memory 225, a path selector 226. Each of the shift register 222, the assumed path memory 223 and the path memory 225 has a multiple-array configuration and is configured in such a way that each can store "1", "0", and "−1". As shown by arrows, they constitute an assumed sample value computing device for computing assumed sample values by means of multiplication and addition.

When allowing for interference to the current sample value from past and future data, the assumed sample value y is obtained on the basis of the sample value $g_i$ taken a one-bit rate from the isolated waveform of FIG. 4 (c), and the path values $a_i$, $b_i$, $c_i$ corresponding to the current, past, and future sample values, respectively. The equation (3), by which this sample value is obtained, is repeated below:

$$y = \sum_{i=-m}^{-m+k-1} g_{-i} a_i + \sum_{i=-m+k}^{n} g_{-i} b_i + \sum_{i=-n}^{-m-1} g_{-i} c_i \quad (3)$$

As described before, if we assume that the constraint length k=3, then m=1, and multiplication and addition will be conducted on the three bits $a_{-1}$, $a_0$, $a_1$ corresponding to the range from i=−1 to i=+1, and the sample values $g_1$, $g_0$, $g_{-1}$ of the isolated waveform.

Given that n=4, multiplication and addition are conducted on the three bits $b_2$, $b_3$, $b_4$ corresponding to the range from i=2 to i=4 of the path memory 225, and the sample values $g_{-2}$, $g_{-3}$, $g_{-4}$ of the isolated waveform. Multiplications and additions are conducted on the three bits $c_{-4}$, $c_{-3}$, $c_{-2}$ corresponding to the range from i=−4 to i=−2 of the shift register 222, and the sample values $g_4$, $g_3$, $g_2$ of the isolated waveform; the results of addition thereof are added up to produce the assumed sample value y. That is, there is a need to phase lock the pulses input into the shift register 222 and the sample value from the A/D converter 217, while assuming i=0 as the current value. A delay processing in the assumed sample value computing portion is performed by means of a selection of the number of stages of the shift register 222, for example.

Figure 17:
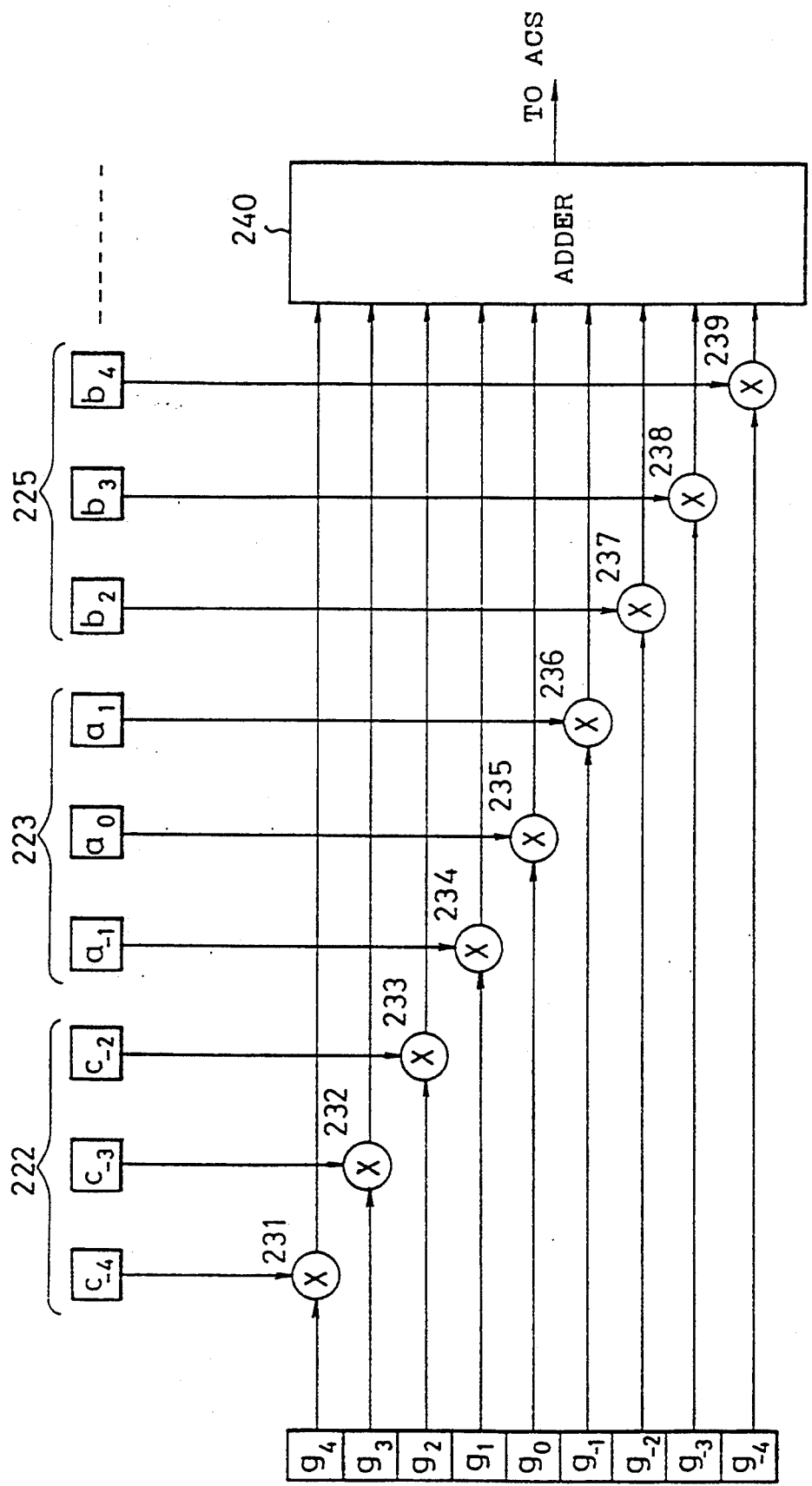
FIG. 17 is a block diagram of an assumed sample value computing portion employed in the fourth embodiment of the present invention.

FIG. 17 is a block diagram of the main portion of the assumed sample computing portion for computing an assumed sample value y according to the equation (3) and comprising the shift register 222, the assumed path memory 223, the path memory 225, the multipliers 231-239 and the adder 240. The 3 bits $c_{-4}$, $c_{-3}$, $c_{-2}$ of the shift register 222, the 3 bits $a_{-1}$, $a_0$, $a_1$ of the assumed path memory 223, the 3 bits $b_2$, $b_3$, $b_4$ of the path memory 225 are supplied to the multipliers 231-239 to be multiplied by the sample values $g_4$-$g_{-4}$ (see FIG. 4 (c)) of the isolated waveform; the outputs of the multipliers 231-239 are supplied to the adder 240, to be added thereby. The output from the adder 240 is input into the ACS circuit 224 as the sample value y. The ACS circuit 224 then calculates the difference of the input value from the sample value. That is, the assumed sample value is obtained, wherein the interference from past data and the interference from future data are both considered.

Figure 18:
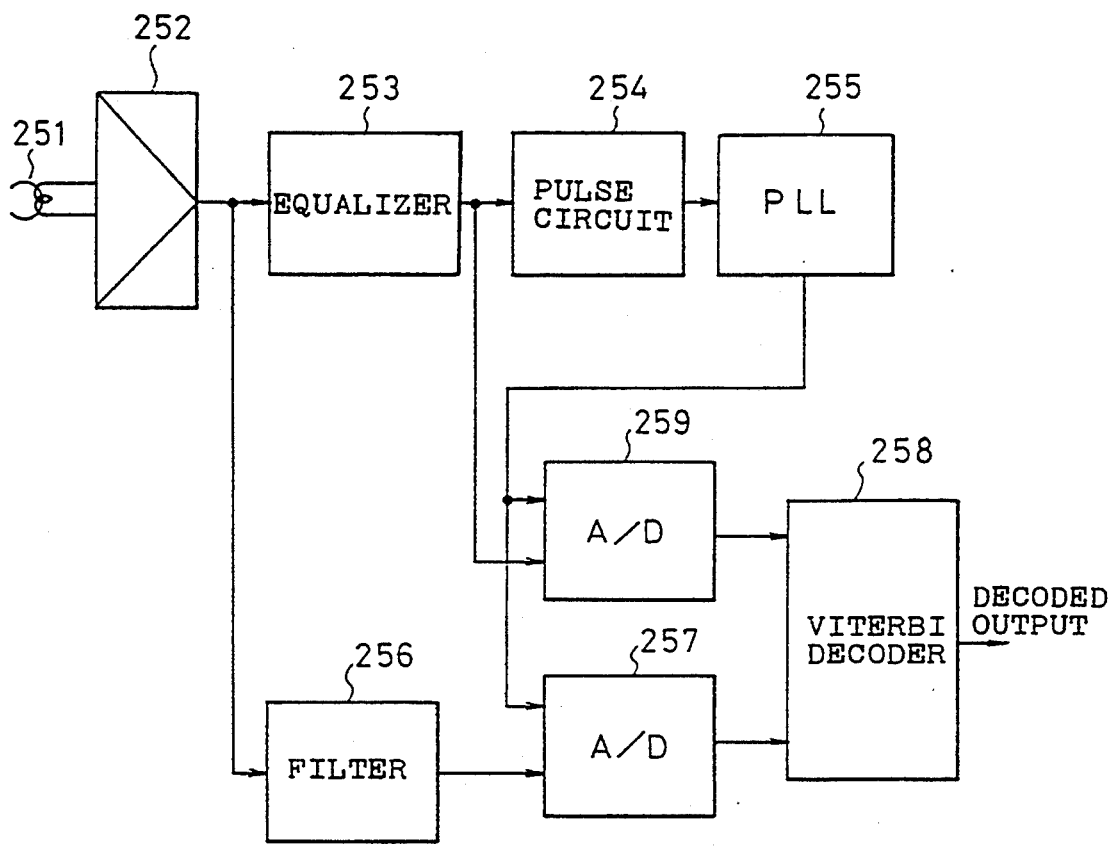
FIG. 18 is a block diagram of the fifth embodiment of the present invention.

FIG. 18 is a block diagram of the fifth embodiment of the present invention. This embodiment comprises a head 251, an amplifier 252, an equalizer 253, a pulse shaper 254, a phase locked loop (PLL) 255, a filter 256, an A/D converter 257, a Viterbi decoder 258 and an A/D converter 259 for sampling and converting the output from the equalizer 253 thereby to produce a digital signal output. The input into the Viterbi decoder 258 is not the pulse from the pulse shaper of the embodiment shown in FIG. 15, but the digital signal obtained through the conversion of the output signal from the equalizer 253 by the A/D converter 259.

The Viterbi decoder 258 has the same configuration as the Viterbi decoder 218 of the previously mentioned embodiment. The sample value obtained by the A/D converter 259 is input into the shift register 222.

Figure 19:
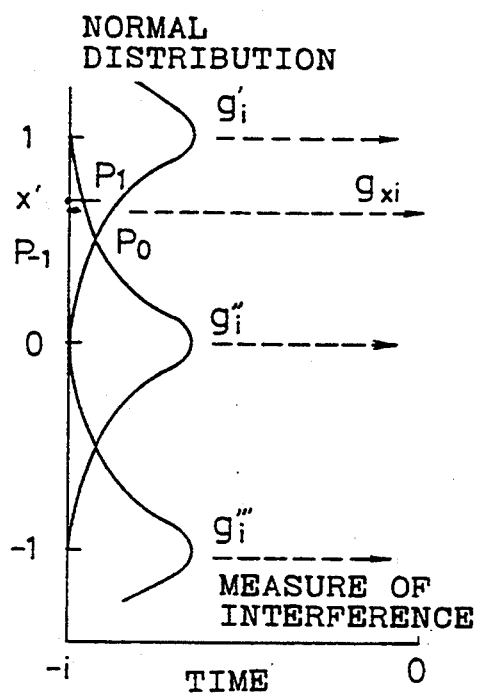
FIG. 19 is a diagram describing a measure of interference.

FIG. 19 is a diagram illustrating a measure of interference, showing the measure of interference caused by the signal at time −i and affecting the signal at time 0. The possible values of the signal at time −i are considered to spread out showing a normal distribution with "1", "0", "−1" in the center, on a condition that interference from other sources is nil because of the equalization. The probability p (X, X') when the relevant sample value is X' is given by $$p(X, X') = \frac{1}{\sqrt{2\pi}\sigma} e^{-\frac{(X-X')^2}{2\sigma^2}} \quad (12)$$

Supposing that the measure of interference affecting the value at time 0 and corresponding to "1", "0", "−1" are $g_i'$, $g_{i'}$, $g_i'''$ respectively, the expected value $g_{Xi}$ of the measure of interference when the sample value is X' is $$g_{Xi} = \frac{g_i' p_i + g_i'' p_0 + g_i''' p_{-1}}{p_i + p_0 + p_{-1}} \quad (13)$$

Inserting the conditions expressed in (14) that follows into (13):

$$\left.\begin{array}{l} g_i' = g_i \\ g_i'' = 0 \\ g_i''' = -g_i \end{array}\right\} \quad (14)$$

$$g_{Xi} = \frac{g_i p_1 - g_i p_{-1}}{p_1 + p_0 + p_{-1}}$$

Figure 20:
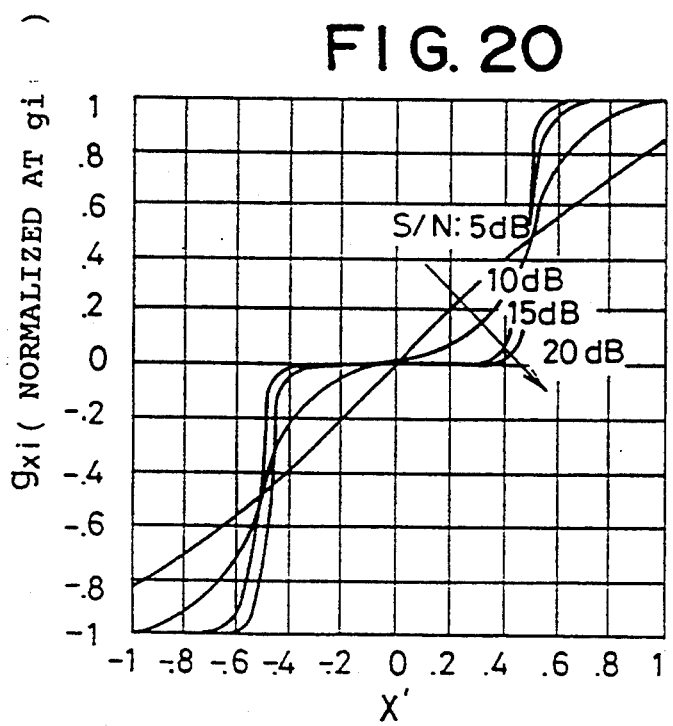
FIG. 20 is a diagram describing an expected value of a measure of interference.

The sample values in the horizontal line are shown in FIG. 20 against the expected values of corresponding measure of interference, with an S/N ratio as a parameter. As is evident from the figure, when the S/N ratio is high, it is better to obtain the measure of interference using the decoded values "0" or "−1" and when the S/N ratio is low, it is better to obtain the measure of interference probabilistically using the sample value.

Allowing for the effect of noise, we can postulate;

$$g_{Xi} = g_i X'$$

which gives the sample value y as:

$$y = \sum_{i=-m}^{-m+k-1} g_{-i} a_i + \sum_{i=-m+k}^{n} g_{-i} b_i + \sum_{i=-k}^{-m-1} g_{-i} X_i' \quad (17)$$

Figure 16:
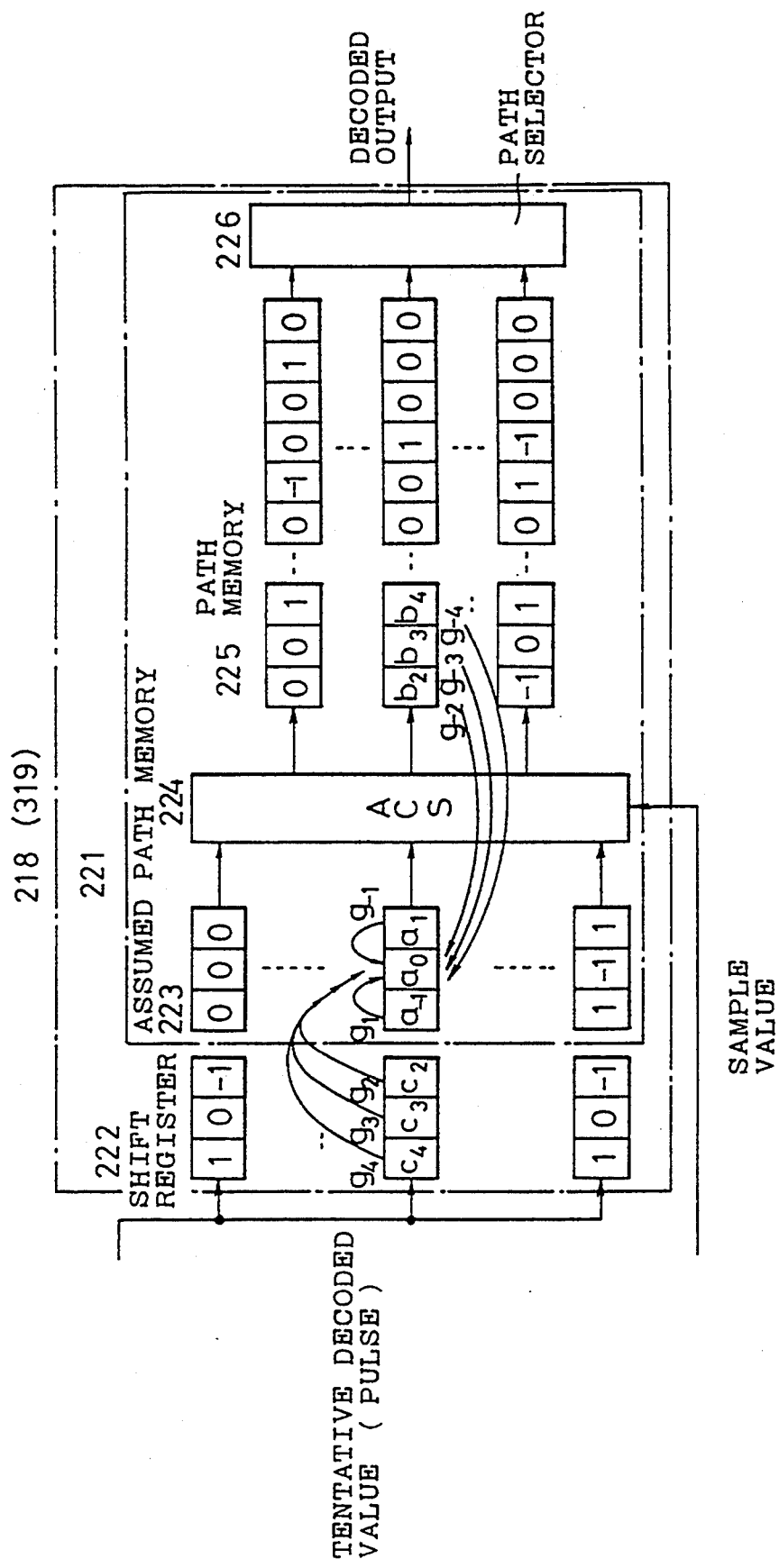
FIG. 16 is a block diagram of a Viterbi decoder employed in the fourth embodiment of the present invention.

Accordingly, the sample value $X_i'$ from the A/D converter 259 in FIG. 18 is input into the shift register 22 of the Viterbi decoder 258 (see FIG. 16). $X_{-2}'$, $X_{-3}'$, $X_{-4}'$, instead of $c_{-2}$, $c_{-3}$, $c_{-4}$, are input. The assumed sample value obtained in accordance with the equation (17) is input into the ACS circuit 224 (see FIG. 16) of the Viterbi decoder 258, after which a new metric value is determined by adding the previous metric value and the output obtained by squaring the difference between the assumed sample value and the sample value from the A/D converter 257, the smaller of the metric values, determined by a comparison, will be selected and the last-in-line value of the selected assumed path is input into the path memory 225 (see FIG. 16).

As described before, even when the intersymbol interference exceeds the range of the assumed path (the constraint length k), an accurate assumption of the assumed sample value is possible namely, when we determine the intersymbol interference from the preceding data in the assumed path (corresponding to the future) by employing a sample value that is affected by less intersymbol interference owing to an equalization performed thereon, by allowing for the effect of noise and by assuming the measure of intersymbol interference after providing a little additional configuration. Accordingly an improvement in an decoding error rate is achieved.

Figure 21:
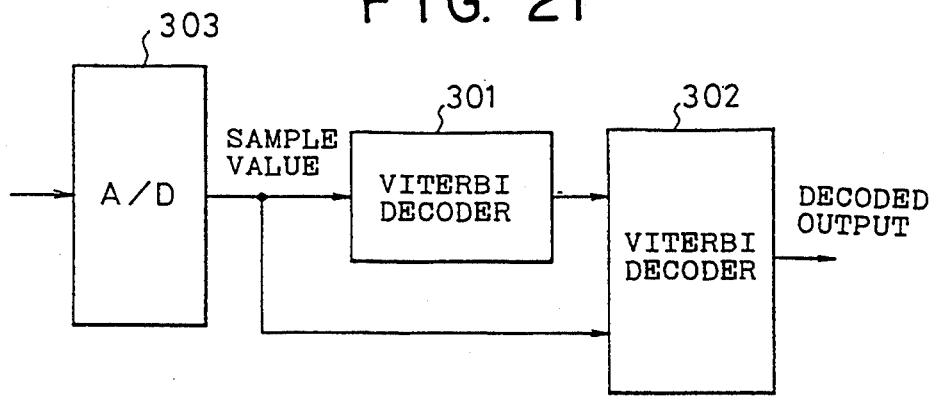
FIG. 21 is a block diagram of the sixth embodiment of the present invention.

FIG. 21 is a block diagram of the main portion of the sixth embodiment of the present invention. The sixth embodiment is designed for assuming, in the Viterbi decoder of the later stage, the measure of interference from the preceding data in the assumed path, for use in decoding, by using the output of the Viterbi decoder of the earlier stage.

This embodiment comprises a first Viterbi decoder 301 for conducting tentative maximum-likelihood decoding on the basis of the sample value resulting from a conversion, in the A/D converter 303, of signal subject to intersymbol interference and a second Viterbi decoder 302 for conducting maximum-likelihood decoding by accepting as inputs the output of the first Viterbi decoder 301 and the previous sample value, wherein the second Viterbi decoder 302 allows an assumption of the measure of interference caused by future data and affecting the current data on the basis of the output of the first Viterbi decoder 301, an assumption of the measure of interference caused by past data and affecting the current data on the basis of the contents of the path memory, so that the assumed sample value is obtained; the assumed sample value thus obtained is compared with the previous sample value so that decoding process is conducted.

The metric value from the ACS circuit of the first Viterbi decoder 301 is input into the ACS circuit of the second Viterbi decoder 302; further, the output of the last stage of the path memory of the first Viterbi decoder 301 is input into the computing portion for computing the assumed sample value to be furnished to the ACS circuit of the second Viterbi decoder 302.

Maximum-likelihood decoding in the second Viterbi decoder 302 is conducted on the basis of the tentative decoded value which went through error correcting decoding in the first Viterbi decoder 301, which means that two-stage error correcting decoding is conducted, thus improving an error rate.

The output of the last stage of the path memory of the first Viterbi decoder 301 is not selected as the decoded output but the output of the last stage is input into the second Viterbi decoder 302 so that the measure of interference caused by future data is assumed. The metric value from the ACS circuit of the first Viterbi decoder 301 is input into the ACS circuit of the second Viterbi decoder 302 to be forwarded to a metric operation for addition. This way a comparison of metric values is easy.

Figure 22:
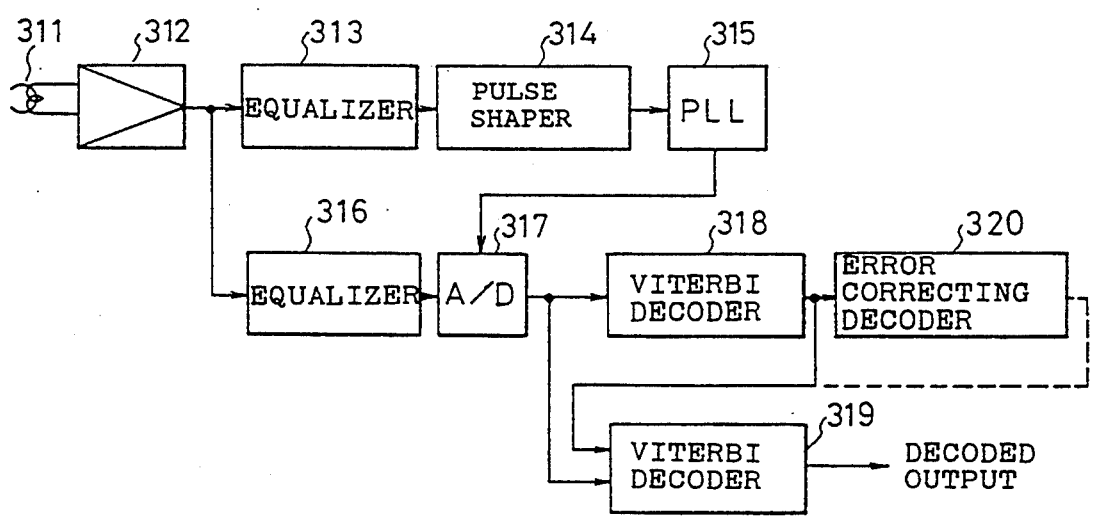
FIG. 22 is a diagram showing the sixth embodiment of the present invention in detail.

FIG. 22 is a block diagram showing the sixth embodiment in detail. The sixth embodiment comprises a magnetic head 311, an amplifier 312, an equalizer 313 and 316, a pulse shaper 314, a phase locked loop (PLL) 315, an A/D converter 317, first and second Viterbi decoders 318 and 319 and an error correcting decoder 320.

Signals reproduced by the magnetic head 311 from a recording medium such as a magnetic disk is subject to intersymbol interference. The read-out signal is amplified by the amplifier 312, undergoes an equalizing amplification by the equalizers 313 and 316 containing filters, as well as being cleared of noise. The read-out signal is then turned into pulses by peak detection in the pulse shaper 314 before being applied to the phase locked loop 315. Clock signals that are synchronous with the read-out signals are furnished from the phase locked loop 315 to the A/C converter 317. The A/D converter 317 carries out a sampling on the read-out signals from the equalizer 316 in accordance with the timing set by the above clock signals. The sample values are furnished to the first and second Viterbi decoder 318 and 319.

The first Viterbi decoder 318 includes an ACS circuit a path memory, a path selector, and a path memory. Decoding is conducted in the same manner as the known art, the decoded output being designated as the tentative decoded value. The second Viterbi decoder 319 uses this tentative decoded value for assumption of the measure of interference from preceding data in the assumed path so that decoding processing is conducted. The need for phase locking the tentative decoded value to the sample value input into the second Viterbi decoder 319 is easily realized by delay circuits such as shift registers because the length of the assumed path (the constraint length) and the length of the path memory give the measure of delay used for obtaining the tentative decoded value.

The error detecting decoder 320 is provided in the case in which the input signal is error detecting coded, and conducts an error detecting decoding on the decoded output from the first Viterbi decoder 318; the decoded result is designated as the tentative decoded value to be input into the second Viterbi decoder 319.

As described before, not only the first Viterbi decoder 318 conducts error detecting decoding but also the second Viterbi decoder 319 conducts error detecting decoding, improving an error rate.

As described before, the assumed sample value y, with consideration given to interference caused by future data, is obtained in accordance with the aforementioned equation (3) on the basis of the sample value $g_i$ taken at one bit rate from the isolated waveform of FIG. 4 (c), and the current, past, and future path values $a_i$, $b_i$, $c_i$ respectively.

The main portion of the second Viterbi decoder 319, for carrying out the processes in accordance with the equation (3), is configured as shown in FIG. 16. The tentative decoded values from the first Viterbi decoder 318 are shifted to the shift register 222 sequentially. The sample values are then input into the ACS circuit 224.

Given that the constraint length k (the length of the assumed path) is 3, the 3 bits of the assumed path memory 223, namely $a_{-1}$, $a_0$, $a_1$, the 3 bits of the path memory 223 namely, $b_2$, $b_3$, $b_4$, the 3 bits of the shift register 222, namely $c_{-2}$, $c_{-3}$, $c_{-4}$ (for the positions of each bit in the sequence, see FIG. 4 (a)), and the sample value $g_1$ of the isolated waveform (for the position of the sample value in the sequence, see FIG. 4 (c)) are utilized as the basis for obtaining the assumed sample value in accordance with the equation (3). FIG. 16 shows that a multiplication and addition are performed on the assumed sample value.

The assumed sample value computing portion for computing the assumed sample value y according to the equation (3) has a configuration shown in FIG. 17. The 3 bits $c_{-4}$, $c_{-3}$, $c_{-2}$ of the shift register at which the assumed sample value from the first Viterbi decoder 318 are furnished to the sample values $g_{-4}$-$g_4$ (see FIG. 4 (c)) of the isolated waveform, the 3 bits $a_{-1}$, $a_0$, $a_1$ in the assumed path memory 223, the 3 bits $b_2$, $b_3$, $b_4$ of the path memory 225 are furnished to the multipliers 231-239 for multiplication. The outputs from the multipliers 231-239 are furnished to the adder 240, whose output is input into the ACS circuit 224 as the assumed sample value y. The ACS circuit 224 calculates the difference between the assumed sample value and the sample value of the input signal. That is, the assumed sample value y is obtained with a consideration given to the interference from both past and future data.

Figure 23:
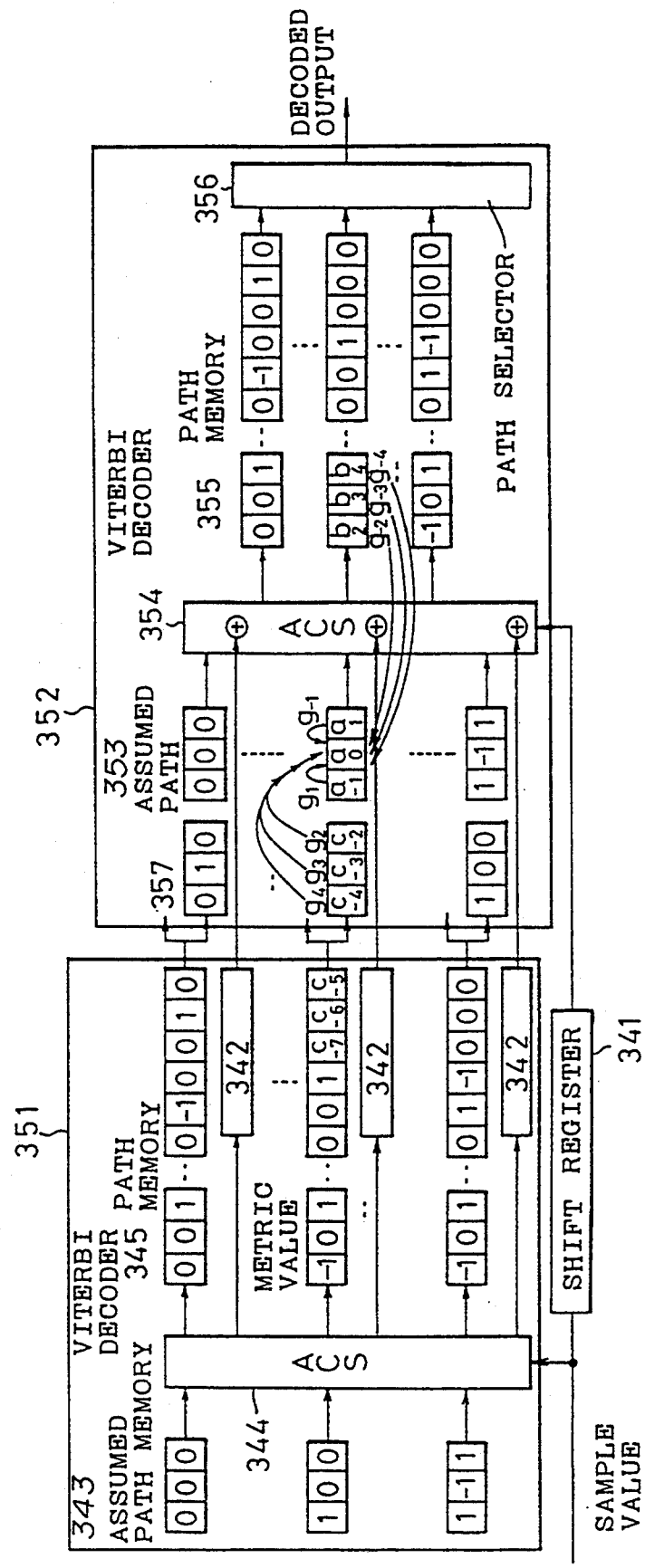
FIG. 23 is a block diagram of the seventh embodiment of the present invention.

FIG. 23 is a block diagram of the main portion of the seventh embodiment of the present invention. The embodiment comprises a first Viterbi decoder 351, a second Viterbi decoder 352, and a shift register 341. The first Viterbi decoder 351 comprises shift registers 342, an assumed path memory 343, an ACS circuit 344, and a path memory 345. The second Viterbi decoder 352 comprises an assumed path memory 353 an ACS circuit 354, a path memory 355 a path selector 356, and a shift register 357.

The sample value is input into the ACS circuit 344 of the first Viterbi decoder 351 and the assumed sample value is obtained in accordance with the equation (1) on the basis of the contents of the assumed path memory 343, or the contents of the path memory 345 is also used so that the assumed sample value can be computed in accordance with the equation 92). A comparison is then made after the output obtained by squaring the difference between the sample value and the assumed sample value are added. The smaller of the metric value, as determined in a comparison, is selected as the next metric value. The metric value selected is input into the ACS circuit 354 of the second Viterbi decoder 352 via the shift register 342, this selection being furnished to the path memory 345 as a piece of information, and the output of the last stage of the path memory 345 is input into the shift register 357 of the second Viterbi decoder 352. The sample value is input into the ACS circuit 354 of the second Viterbi decoder 352 via the shift register 341.

The shift registers 341, 342 act as delay circuits for phase locking the first Viterbi decoder 351 and the second Viterbi decoder 352, the selection being based on the length of the path memory 343 of the first Viterbi decoder 351 and the length of the path memory 345.

As shown by arrows, the assumed sample value is computed in the second Viterbi decoder 353 by performing multiplication and addition in accordance with the equation (3) on the basis of the contents of the shift register 357, the contents of the assumed path memory 353, and contents of the path memory 355. In the ACS circuit 354, an addition is carried out on the output obtained by squaring the difference between the assumed sample value and the sample value input via the shift register 341, and on either the previous metric value or the metric value input via the shift register 342. A comparison is then made as to each metric value and the smaller one is selected as the next metric value. Accordingly, not only the value of the path memory 345 that has a likelihood of being a decoded value of the first Viterbi decoder 351 but the metric value that shows the likelihood thereof are transmitted to the second Viterbi decoder 352, so that maximum-likelihood decoding is conducted, improving an error rate.

The present invention is not limited to the embodiments already described, but further has application in the decoding of signals subject to intersymbol interference other than the read-out signals of a magnetic recording apparatus.

POSSIBLE USE IN THE INDUSTRY

As has been described, maximum-likelihood decoding method and device of the present invention can decrease a decoding error rate without enlarging the scale of the circuit, and can find its application in the reproducing of the signals in a magnetic recording apparatus, for example.

We claim:

1. A maximum-likelihood decoding method for decoding an input signal subject to intersymbol interference, comprising the steps of:

(a) assuming a measure of interference caused by a future signal, that is later in time sequence than an assumed data sequence, on the basis of predetermined bits of sample values of said input signal that is earlier in time sequence than the assumed data sequence stored in an assumed path memory;

(b) obtaining a sample value of said input signal by referring to the measure of interference; and (c) generating a plurality of survivor paths by conducting maximum-likelihood decoding on said input signal, employing an assumed sample value and said obtained sample value of said input signal and, thereafter, storing the generated survivor paths in a path memory and outputting data of the most likely survivor path as a decoded data sequence.

2. A maximum-likelihood decoding method as claimed in claim 1, wherein:

said step (a) comprises a step of assuming a measure of interference, caused by said future signal, on the basis of said predetermined bits of sample values of said input signal and said assumed data sequence; and said step (c) comprises a step of obtaining an assumed sample value on the basis of said assumed data sequence and data of said survivor path.

3. A maximum-likelihood decoding method as claimed in claim 1, further comprising:

in step (a), assuming said measure of interference caused by said future signal, on the basis of said predetermined bits of sample values of said input signal and of said assumed data sequence; and (d) assuming a measure of interference caused by a past signal that is earlier in time sequence than said assumed data sequence, on the basis of predetermined bits of sample values of an input signal that are later in time sequence than said assumed data sequence, and wherein said step (b) further comprises a step of obtaining said assumed sample value, on the basis of a measure of interference caused by said future signal, said assumed data sequence and a measure of interference caused by said past signal.

4. A maximum-likelihood decoding method as claimed in claim 1, further comprising:

in step (a), assuming a measure of interference caused by said future signal, on the basis of said predetermined bits of sample value of an input signal and said assumed data sequence;

(d) obtaining a first measure of interference caused by a past signal that is later in a sequence than said assumed data sequence, on the basis of a plurality of bits of sample values of said input signal that are later in time sequence than said assumed data sequence;

(e) obtaining a second measure of interference caused by a past signal on the basis of data of said survivor path;

(f) selecting the second measure of interference caused by said past signal when an output data from the last storage of said path memory converges, and selecting the first measure of interference caused by said past signal when there is no convergence; and said step (b) obtains said assumed sample value on the basis of the selected measure of interference, said assumed data sequence and the measure of interference caused by said future signal.

5. A maximum-likelihood decoding method as claimed in claim 1, further comprising:
 (d) generating a tentative decoded data sequence by equalizing and digitizing said input signal, wherein said step (b) further comprises a step of obtaining an assumed sample value in accordance with the following equation:

$$y = \sum_{i=-m}^{-m+k-1} g_{-i}a_i + \sum_{i=-m+k}^{n} g_{-i}b_i + \sum_{i=-n}^{-m-1} g_{-i}c_i$$

where $a_i$ represents one bit of an assumed data sequence stored in an assumed path memory, $b_i$ represents one bit of decoded data sequence stored in a path memory, $c_i$ represents one bit of a tentative decoded data sequence obtained in step (d), $g_{-i}$ represents a sample value of an input signal having an isolated waveform, g represents an assumed sample value, and each of $i, k, m$ represents an integer.

6. A maximum likelihood decoding method as recited in claim 1, further comprising:
 in step (b), obtaining an assumed sample value in accordance with the following equation:

$$y = \sum_{i=-m}^{-m+k-1} g_{-i}a_i + \sum_{i=-m+k}^{n} g_{-i}b_i +$$

$$g_{-(-m-1)}\left[ X_{-m-1} - \left( \sum_{i=-m}^{-m+k-1} g_{-(i+m+1)}a_i + \sum_{i=-m+k}^{n} g_{-(i+m+1)}b_i \right) \right]$$

where $a_i$ represents one bit of an assumed data sequence stored in an assumed path memory, $b_i$ represents one bit of decoded data sequence stored in a path memory, $g_{-i}$ represents a sample value of an input signal having an isolated waveform, $X_{-m-1}$ represents a sample value of an input signal, y represents an assumed sample value, and each of $i, k, m$ represents an integer.

7. A maximum-likelihood method as claimed in claim 1, further comprising:
 in step (b), obtaining an assumed sample value in accordance with the following equation:

$$y = \sum_{i=-m}^{-m+k-1} g_{-i}a_i + g_{-(m+1)} \times$$

$$\left[ X_{m+1} - \left( \sum_{i=-m}^{-m+k-1} g_{-(i-m-1)}a_i \right) \right] + g_{-(-m-1)} \times$$

$$\left[ X_{-m-1} - \left( \sum_{i=-m}^{-m+k-1} g_{-(i+m+1)}a_i \right) \right]$$

where $a_i$ represents one bit of an assumed data sequence stored in an assumed path memory, $b_i$ represents one bit of a decoded data sequence stored in a path memory, $g_{-1}$ represents a sample value of an input signal having an isolated waveform, $X_{m+1}$ and $X_{-m-1}$ each represents a sample value of an input signal, y represents an assumed sample value, and each of $i, k, m$ represents an integer.

8. A maximum-likelihood decoding method as claimed in claim 1, further comprising:
 (d) generating a tentative decoded data sequence by conducting maximum-likelihood decoding on a sample value of said input signal; and
 in step (b), obtaining an assumed sample value in accordance with the following equation:

$$y = \sum_{i=-m}^{-m+k-1} g_{-i}a_i + \sum_{i=m+k}^{n} g_{-i}b_i + \sum_{i=-n}^{-m-1} g_{-i}c_i$$

where $a_i$ represents one bit of an assumed data sequence stored in an assumed path memory, $b_i$ represents one bit of a decoded data sequence stored in a path memory, $c_i$ represents one bit of a tentative decoded data sequence obtained in step (d), $g_{-1}$ represents a sample value of an input signal having an isolated waveform, y represents an assumed sample value, and each of $i, k, m$ represents an integer.

9. A maximum-likelihood decoding method as claimed in claim 8, further comprising:
 (e) conducting an error correcting decoding on a tentative decoded data sequence generated in step (d), and generated a tentative decoded data sequence.

10. A maximum-likelihood decoding device comprising:
 A/D (analog/digital) converting means for conducting sampling on an input signal and generating a sample value;
 an assumed path memory for storing an assumed data sequence;
 an assumed sample value computing means for computing an assumed sample value of said input signal by assuming a measure of interference caused by a future signal that is later in time sequence than an assumed data sequence on the basis of predetermined bits of sample values of said input signal that are earlier in time sequence than an assumed data sequence stored in said assumed path memory, and by referring to said measure of interference; and
 decoding means for outputting the most likely one of a plurality of survivor paths, as a decoded data sequence, after storing the survivor paths generated by conducting maximum-likelihood decoding on said input signal on the basis of said assumed sample value and a sample value of said input signal.

11. A maximum-likelihood decoding device as claimed in claim 10, wherein said assumed sample value computing means further comprises:
 first means for assuming a measure of interference caused by said future signal, on the basis of said predetermined bits of sample values of an input signal and said assumed data sequence; and
 second means for obtaining said assumed sample value on the basis said measure of interference, said assumed data sequence, and a survivor path.

12. A maximum-likelihood decoding device as claimed in claim 10, wherein:
 said assumed sample value computing means comprises first means for assuming a measure of interference caused by said future signal on the basis of said predetermined bits of sample values of an input signal and said assumed data sequence;
 said maximum-likelihood decoding device comprises second means for assuming a measure of interference caused by a past signal that is earlier in time sequence than said assumed data sequence, on the basis of a predetermined bits of sample values of an input signal that are later in time sequence than said assumed data sequence, and said assumed sample value computing means comprises third means for obtaining said assumed sample value on the basis of a measure of interference caused by said future signal, said assumed data sequence, and a measure of interference caused by said past signal.

13. A maximum-likelihood decoding device as claimed in claim 10, wherein;

said assumed sample value computing means further comprises first means for assuming a measure of interference on the basis of said predetermined bits of sample values of an input signal and said assumed data sequence and said maximum-likelihood decoding device further comprises:

second means for obtaining a firs measure of interference caused by a past signal that is earlier in a sequence than said assumed data sequence, on the basis of a plurality of bits of sample values of said input signal that are later in a sequence than said assumed data sequence;

third means for obtaining a second measure of interference caused by a past signal, on the basis of data of said survivor path;

fourth means for selecting the second measure of interference caused by said past signal when an output from the last storage of said path memory converges, and for selecting the first measure of interference caused by said past signal when there is no convergence; and said assumed sample value computing means obtains said assumed sample value on the basis of the measure of interference selected, said assumed data sequence, and a measure of interference caused by said future signal.

14. A maximum-likelihood decoding device as claimed in claim 10, further comprising:

generating means for generating a tentative decoded data sequence by equalizing and digitizing said input signal; and said assumed sample value computing means further comprises means for obtaining assumed sample value in accordance with the following equation:

$$y = \sum_{i=-m}^{-m+k-1} g_{-i} a_i + \sum_{i=-m+k}^{n} g_{-i} b_i + \sum_{i=-n}^{-m-1} g_{-i} c_i$$

where $a_i$ represents one bit of assumed data sequence stored in an assumed path memory, $b_i$ represents one bit of a decoded data sequence stored n a path memory, $c_i$ represents one bit of a tentative decoded data sequence obtained in step (d), $g_{-i}$ represents a sample value of an input signal having an isolated waveform, g represents an assumed sample value, and each of $i$, $k$, $m$ represents an integer.

15. A maximum-likelihood decoding device as claimed in claim 10, wherein:

said assumed sample value computing means further comprises means for obtaining an assumed sample value in accordance wit the following equation:

$$y = \sum_{i=-m}^{-m+k-1} g_{-i} a_i + g_{-(m+1)} \times$$

$$\left[ X_{m+1} - \left( \sum_{i=-m}^{-m+k-1} g_{-(i-m-1)} a_i \right) \right] + g_{-(-m-1)} \times$$

$$\left[ X_{-m-1} - \left( \sum_{i=-m}^{-m+k-1} g_{-(i-m+1)} a_i \right) \right]$$

where $a_i$ represents one bit of an assumed data sequence stored in an assumed path memory, $b_i$ represents one bit of a decoded data sequence stored in a path memory, $g_{-i}$ represents a sample value of an input signal having an isolated waveform, $x_{m+1}$ and $X_{-m-1}$ each represents a sample value of an input signal, and each of $i$, $k$, $m$ represents an integer.

16. A maximum-likelihood decoding device as claimed in claim 10, wherein said assumed sample value computing means comprises steps for obtaining an assumed sample value in accordance with the following equation:

$$y = \sum_{i=-m}^{-m+k-1} g_{-i} a_i + g_{-(m+1)} \times$$

$$\left[ X_{m+1} - \left( \sum_{i=-m}^{-m+k-1} g_{-(i-m-1)} a_i \right) \right] + g_{-(-m-1)} \times$$

$$\left[ X_{-m-1} - \left( \sum_{i=-m}^{-m+k-1} g_{-(i-m+1)} a_i \right) \right]$$

where $a_i$ represents one bit of an assumed data sequence stored in an assumed path memory, $b_i$ represents one bit of a decoded data sequence stored in a path memory, $g_{-i}$ represents a sample value of an input signal having an isolated waveform, $X_{m+1}$ and $X_{-m-1}$ each represents a sample value of an input signal, and $i$, $k$, m each represents an integer.

17. A maximum-likelihood decoding device as claimed in claim 10, further comprising:

generating means for conducting maximum-likelihood decoding on a sample value of said input signal and for generating a tentative decode data sequence, wherein said assumed sample value computing means further comprises means for obtaining an assumed sample value in accordance with the following equation:

$$y = \sum_{i=-m}^{-m+k-1} g_{-i} a_i + \sum_{i=m+k}^{n} g_{-i} b_i + \sum_{i=-n}^{-m-1} g_{-i} c_i$$

where $a_i$ represents one bit of an assumed data sequence stored in an assumed path memory, $b_i$ represents one bit of a decoded data sequence stored in a path memory, $c_i$ represents one bit of a tentative decoded data sequence, $g_{-i}$ represents a sample value of an input signal having an isolated waveform, y represents an assumed sample value, and each of $i$, $k$, $m$ represents an integer;

said generating means comprises a first Viterbi decoder, said A/D converting means, an assumed path memory and an assumed sample value computing means; and said decoding means constitutes a second Viterbi decoder.

18. A maximum-likelihood decoding device as claimed in claim 17, further comprising:

generating means for generating a tentative decoded data sequence after conducting error correcting decoding on a tentative decoded data sequence generated in said generating means.

19. A maximum-likelihood decoding device as claimed in claim 18, wherein said generating means generates said tentative decoded data sequence by generating pulses from the equalized input.

20. A maximum-likelihood decoding device as claimed in claim 14, wherein said generating means further comprises:
 clock pulse generating means for generating clock pulses based on an equalized input signal; and
 A/D converting means for generating said tentative decoded data sequence by digitizing an input signal that is equalized in synchronization with said clock pulses.

\* \* \* \* \*

UNITED STATES PATENT AND TRADEMARK OFFICE
CERTIFICATE OF CORRECTION

PATENT NO. : 5,432,820

DATED : July 11, 1995

INVENTOR(S) : SUGAWARA et al.

Figure 1:
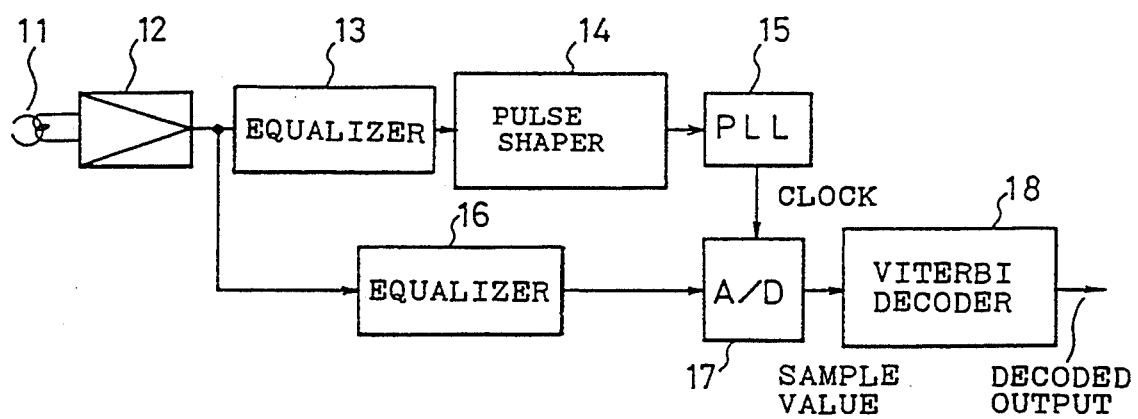
FIG. 1 is a block diagram showing a demodulating system of a conventional magnetic recording apparatus.
Figure 3:
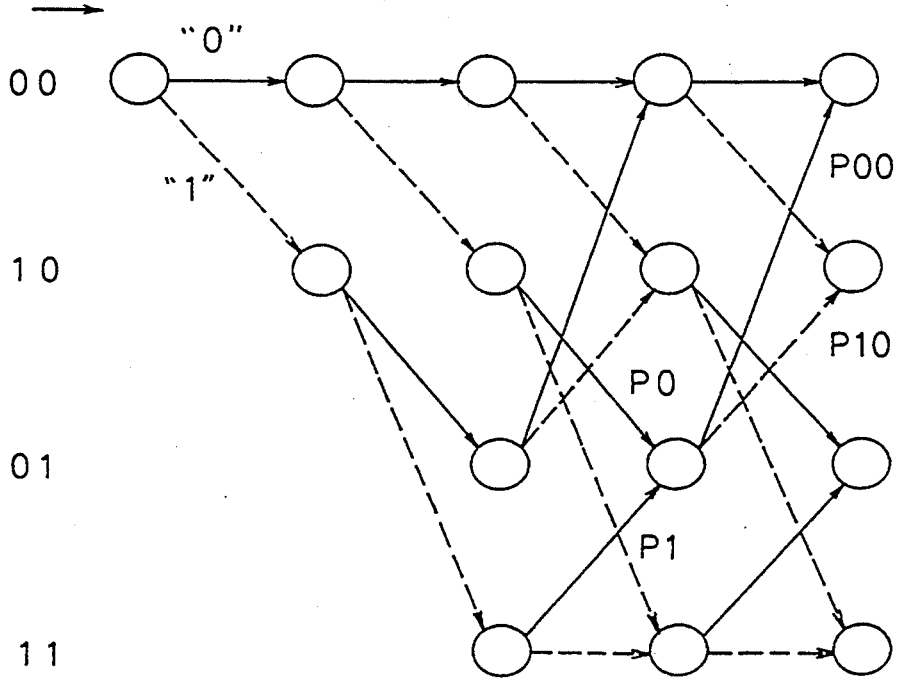
FIG. 3 is a trellis diagram when the constraint length is 3.
Figure 2:
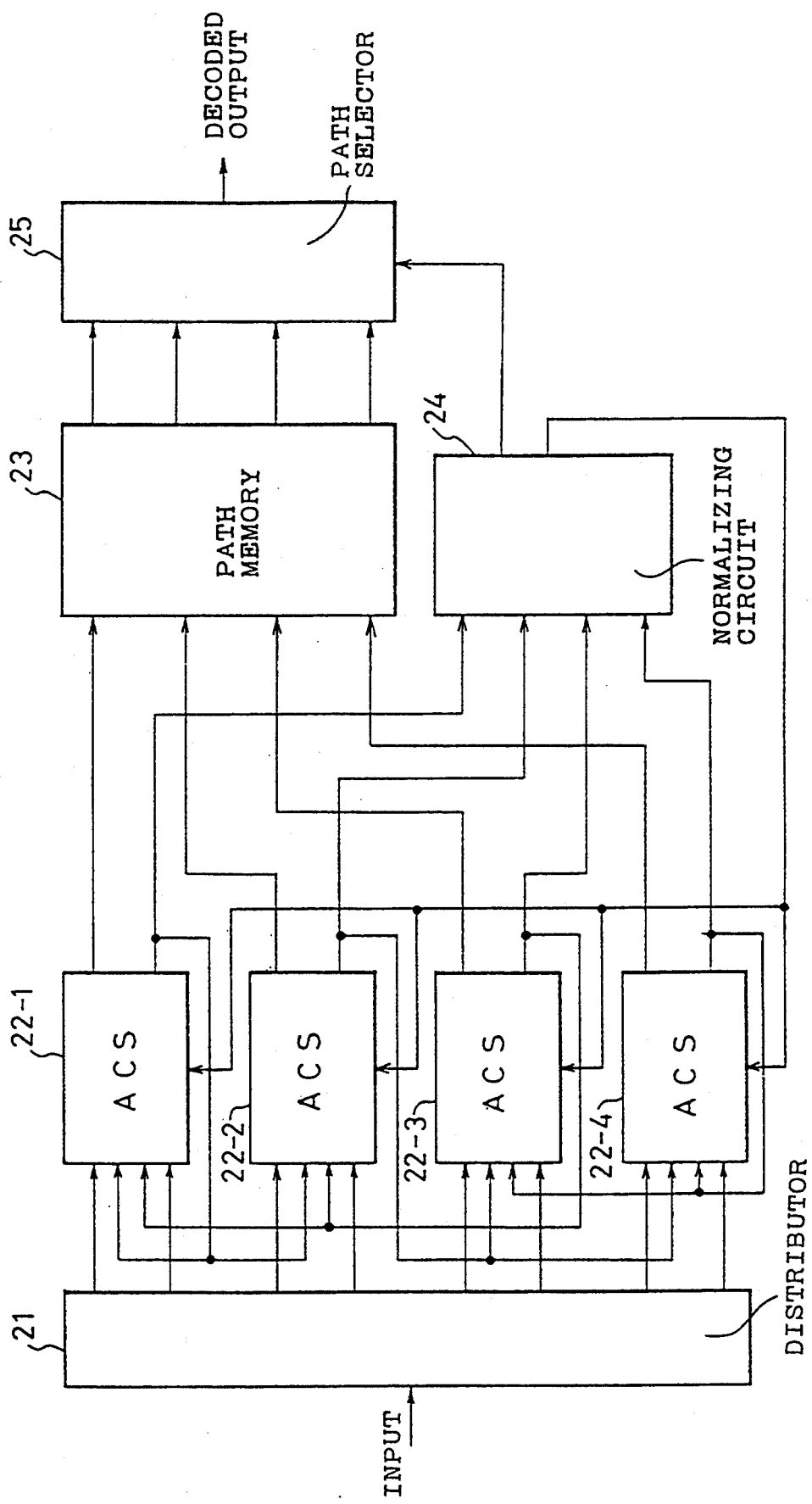
FIG. 2 is a block diagram showing a conventional Viterbi decoder.
Figure 4A:
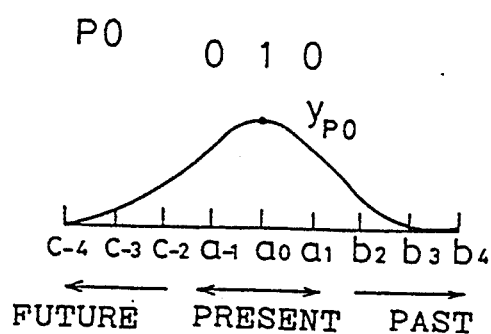
FIGS. 4a–4e show diagrams describing signal waveforms.
Figure 4B:
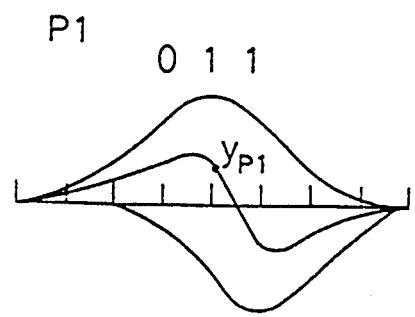
Figure 4C:
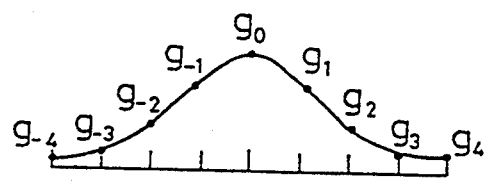
Figure 4D:
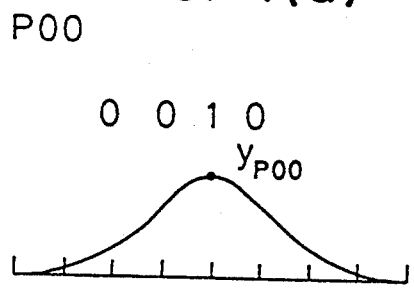
Figure 4E:
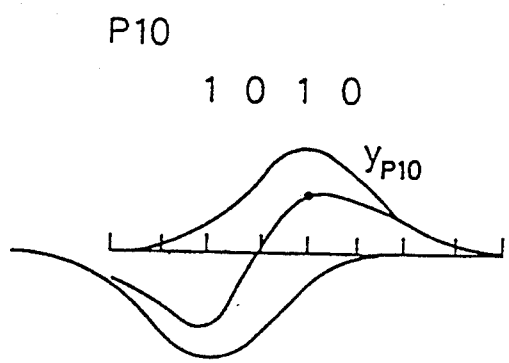
Figure 5:
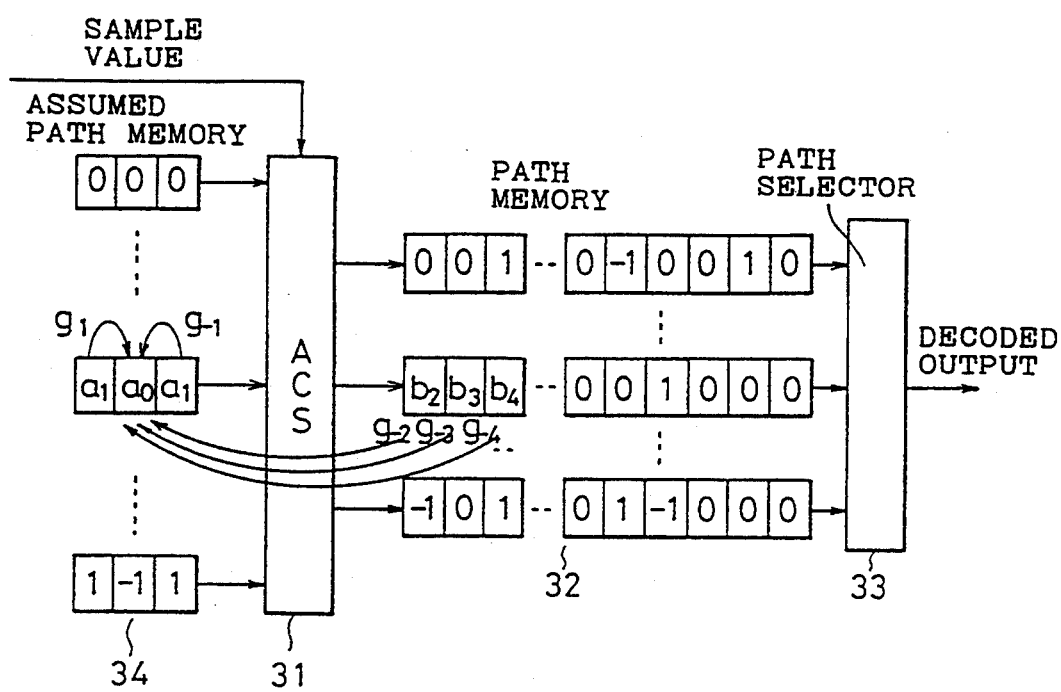
FIG. 5 is a block diagram showing a main portion of a conventional Viterbi decoder.

It is certified that error appears in the above-indentified patent and that said Letters Patent is hereby corrected as shown below:

Col. 1,     line 51, change "all" to --are--;
            line 53, change "Viterbi" to --A Viterbi--;
            line 62, after "Fig. 2" insert --thus--.

Col. 3,     line 41, delete "like";
            line 59, after "sequence" insert --,--.

* Col. 4,     line 9, change "on of" to --of an--.

Col. 6,     line 54, after "spread" insert --, i.e.,--.

Col. 7,     line 16, after "system" insert --,--;
*             line 17, after "at" insert --a--.

Col. 9,     line 3, after "$g_{-1}$" insert --,--;
            line 60, after "is" insert --:--.

Col. 10,     line 13, after "is" insert --:--;
            line 46, delete "the" (first occurrence).

Col. 12,     line 27, after "pulses" insert --,--; after "corresponding" insert --to--; and after ""0"" insert --values--;
            line 29, change "value" to --values--.

Col. 15,     line 17, change "obtained;" to --obtained,--;
            line 18, change "is" to --being--;
            line 19, after "that" insert --the--.

UNITED STATES PATENT AND TRADEMARK OFFICE
CERTIFICATE OF CORRECTION

PATENT NO. : 5,432,820
DATED : July 11, 1995
INVENTOR(S) : SUGAWARA et al.

It is certified that error appears in the above-indentified patent and that said Letters Patent is hereby corrected as shown below:

* Col. 21, line 19, change "firs" to --first--;
* line 54, change "n a" to --in a--;
* line 64, change "wit" to --with--.

Signed and Sealed this

Twenty-sixth Day of December, 1995

Attest:

BRUCE LEHMAN

Attesting Officer          Commissioner of Patents and Trademarks